(12) United States Patent
Yun et al.

(10) Patent No.: US 8,587,052 B2
(45) Date of Patent: Nov. 19, 2013

(54) SEMICONDUCTOR DEVICES AND METHODS OF FABRICATING THE SAME

(75) Inventors: Jang-Gn Yun, Hwaseong-si (KR); Kwang-Soo Seol, Yongin-si (KR); Jungdal Choi, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/402,171

(22) Filed: Feb. 22, 2012

(65) Prior Publication Data

US 2013/0032875 A1 Feb. 7, 2013

(30) Foreign Application Priority Data

Aug. 4, 2011 (KR) ........................ 10-2011-0077702

(51) Int. Cl.
*H01L 29/792* (2006.01)
(52) U.S. Cl.
USPC ...... 257/324; 257/315; 257/319; 365/185.23; 365/185.05
(58) Field of Classification Search
USPC ......... 438/261, 268, 269, 155, 149, 479, 637, 438/675; 257/324, 326, 314, 315, 331, 522, 257/773, 734, 327
See application file for complete search history.

(56) References Cited

U.S. PATENT DOCUMENTS

| | | | |
|---|---|---|---|
| 2008/0099819 A1* | 5/2008 | Kito et al. | 257/315 |
| 2008/0253183 A1* | 10/2008 | Mizukami et al. | 365/185.05 |
| 2010/0039865 A1* | 2/2010 | Kidoh et al. | 365/185.23 |
| 2010/0096682 A1 | 4/2010 | Fukuzumi et al. | |
| 2011/0108907 A1* | 5/2011 | Maeda | 257/324 |
| 2012/0205608 A1* | 8/2012 | Yamauchi et al. | 257/4 |
| 2012/0299082 A1* | 11/2012 | Park | 257/319 |

* cited by examiner

*Primary Examiner* — Bac Au
*Assistant Examiner* — Sophia Nguyen
(74) *Attorney, Agent, or Firm* — Harness, Dickey & Pierce, P.L.C.

(57) ABSTRACT

One example embodiment of a semiconductor device includes a memory cell array formed on a substrate. The memory cell array includes a gate stack including alternating conductive and insulating layers. A first lower conductive layer in the gate stack has a portion disposed below a first upper conductive layer in the gate stack, and a first contact area of the first lower conductive layer is disposed higher than a second contact area of the first upper conductive layer. The semiconductor device further includes first and second contact plugs extending into the gate stack to contact the first and second contact areas, respectively.

14 Claims, 48 Drawing Sheets

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0077702, filed on Aug. 4, 2011, in the Korean Intellectual Property Office, the entire contents of which are hereby incorporated by reference.

BACKGROUND OF THE INVENTION

Embodiments of the inventive concepts relate generally to a semiconductor device. More particularly, embodiments of the inventive concepts relate to semiconductor devices and/or methods of fabricating the same.

A vertical channel semiconductor device may have a terraced contact area structure for facilitating electric connection with contact plugs. However, the more the layer number of word lines, the more a terracing and/or metal-plugging process may be performed. This may lead to various technical difficulties, such as a reduction in product yield and/or an increase in failure rates.

SUMMARY

Some embodiments of the inventive concepts provide methods capable of reducing the number of process steps for fabricating a semiconductor device.

Some embodiments of the inventive concepts provide semiconductor devices, whose structure is configured to be able to reduce the number of process steps.

Still other embodiments of the inventive concepts provide semiconductor devices and methods of fabricating the same, capable of increasing a product yield.

One example embodiment of a semiconductor device includes a memory cell array formed on a substrate. The memory cell array includes a gate stack including alternating conductive and insulating layers. A first lower conductive layer in the gate stack has a portion disposed below a first upper conductive layer in the gate stack, and a first contact area of the first lower conductive layer is disposed higher than a second contact area of the first upper conductive layer. The semiconductor device further includes first and second contact plugs extending into the gate stack to contact the first and second contact areas, respectively.

In one embodiment, the gate stack may include a second lower conductive layer and a second upper conductive layer. The second lower conductive layer has a portion disposed below the second upper conductive layer, and a third contact area of the second lower conductive layer is disposed higher than a fourth contact area of the second upper conductive layer.

In one embodiment, the first lower conductive layer may be disposed below the second lower conductive layer, and the first upper conductive layer may be disposed below the second upper conductive layer.

In one embodiment, the first contact area and the fourth contact area are at a substantially same level.

In one embodiment, the first lower conductive layer has a stair shaped cross-section and the second upper conductive layer has one of an L-shaped cross-section and a linear cross-section.

In one embodiment, a riser of the stair-shaped cross-section is substantially perpendicular to a runner of the stair-shaped cross-section.

In one embodiment, a riser and a runner of the stair shaped cross-section form an angle greater than 90 degrees.

In one embodiment, the substrate has a first upper surface and a second upper surface, and the second upper surface is higher than the first upper surface. The conductive layer having the stair shaped cross-section is formed over the first and second upper surfaces, and the conductive layer having the L-shaped cross-section is formed over the first upper surface. In one embodiment, a peripheral circuit device may be disposed over the second surface.

In another embodiment, an insulation pattern is disposed over a first portion of the substrate, and the conductive layer having the stair shaped cross-section is formed over the insulation pattern and a second portion of the substrate not covered by the insulation pattern. The conductive layer having the L-shaped cross-section is formed over the second portion of the substrate. In one embodiment, the insulation pattern may be disposed over a peripheral circuit device.

In one embodiment, at least two of the conductive layers have respective contact areas at substantially a same first level. In another embodiment, at least one conductive layer has a contact area at a second level, and the second level is different from the first level.

In one embodiment, at least one of the insulation layers has a different thickness than another of the insulation layers.

In another embodiment, at least one of the conductive layers has a different thickness than another of the conductive layers.

As one example, the conductive layers may include polysilicon. As another example, the conductive layers may include a metal.

In one embodiment, at least one vertical channel penetrates the gate stack, and a memory layer surrounds a length of the vertical channel. For example, the memory layer may include a tunnel layer, a charge trap layer and a blocking layer. As another example, the memory layer may include a variable resistance material.

In another embodiment, at least one vertical channel penetrates the gate stack, and each of plurality of memory layers is disposed between the vertical channel and an associated one of the conductive layers. Each memory layer may also be disposed on upper and lower surfaces of the associated conductive layer. As one example, the memory layer may include a tunnel layer, a charge trap layer and a blocking layer.

In a further embodiment, at least one vertical channel penetrating the gate stack, a first memory layer surrounds a length of the vertical channel, and each of a plurality of second memory layers is disposed between the vertical channel and an associated one of the conductive layers. Each second memory layer may also be disposed on upper and lower surfaces of the associated conductive layer. As an example, the first memory layer may include a tunnel layer, and the second memory layers each may include a blocking layer.

In one embodiment, the semiconductor device includes a plurality of memory layers, and each of the plurality of memory layers is formed on at least one side surface of the gate stack. A dielectric layer may be formed on each of the plurality of memory layers.

Another embodiment of the semiconductor device includes a memory cell array formed on a substrate. The memory cell array includes a gate stack having alternating conductive and insulating layers. At least two of the conductive layers have respective first and second contact areas at substantially a same first level, and at least one conductive layer has a third contact area at a second level. The second level is different from the first level. The semiconductor device further includes first through third contact plugs extending into the gate stack to contact the first through third contact areas, respectively.

In one embodiment, at least one conductive layer has a fourth contact area substantially at the second level.

A further embodiment of the semiconductor device includes a substrate having a first upper surface and a second upper surface. The second upper surface is higher than the first upper surface. A memory cell array is formed on the substrate. The memory cell array includes a gate stack formed on at least the first upper surface of the substrate such that the gate stack projects above the second upper surface. The gate stack includes alternating conductive and insulating layers. Contact plugs extend into the gate stack to contact the associated contact areas.

In one embodiment, a first of the associated contact areas is over the first upper surface, and a second of the associated contact areas is over the second upper surface.

In one embodiment, at least one conductive layer has a contact area at a different level from the first and second associated contact areas.

One embodiment of a method of forming a semiconductor device includes forming a gate stack including alternating conductive and insulating layers. A first lower conductive layer in the gate stack has a portion disposed below a first upper conductive layer in the gate stack, and a first contact area of the first lower conductive layer is disposed higher than a second contact area of the first upper conductive layer. The method further includes etching the gate stack to form a contact hole exposing at least the first contact area, and forming a contact plug in the contact hole to contact the first contact area.

Another embodiment of the method of forming a semiconductor device includes forming a gate stack including alternating conductive and insulating layers. At least two of the conductive layers have respective first and second contact areas at substantially a same first level, and at least one conductive layer has a third contact area at a second level. The second level is different from the first level. The method further includes etching the gate stack to simultaneously form contact holes exposing at least the first and second contact areas, and forming contact plugs in the contact holes to contact the first and second contact areas.

In an embodiment of a method of forming a gate stack, the method includes processing a substrate to form a first upper surface of the substrate and a second upper surface of the substrate, where the second upper surface is higher than the first upper surface. The method further includes forming a mold stack on the substrate such that the mold stack is formed on the first upper surface and the second upper surface of the substrate. The mold stack includes alternating conductive and insulating layers. The mold stack is processed to form a gate stack. The gate stack has a portion that projects above the second upper surface.

Embodiments are also directed to applications of the semiconductor device and methods. For example, a memory card including a semiconductor device according to one of the above described embodiments. Another example is a processing system including a semiconductor device according to one of the above described embodiments.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3A through 11A show a method of fabricating a semiconductor device according to example embodiments of the inventive concepts and are sectional views taken along xz-plane in FIG. 1A;

FIGS. 3B through 11B show a method of fabricating a semiconductor device according to example embodiments of the inventive concepts and are sectional views taken along yz-plane in FIG. 1A;

FIGS. 14A through 19A show a method of fabricating a semiconductor device according to yet other example embodiments of the inventive concepts and are sectional views taken along xz-plane in FIG. 1A;

FIGS. 14B through 19B show a method of fabricating a semiconductor device according to yet other example embodiments of the inventive concepts and are sectional views taken along yz-plane in FIG. 1A;

FIGS. 20A through 25A show a method of fabricating a semiconductor device according to further example embodiments of the inventive concepts and are sectional views taken along xz-plane in FIG. 1A;

FIGS. 20B through 25B show a method of fabricating a semiconductor device according to further example embodiments of the inventive concepts and are sectional views taken along yz-plane in FIG. 1A;

FIGS. 26A through 29A show a method of fabricating a semiconductor device according to still further example embodiments of the inventive concepts and are sectional views taken along xz-plane in FIG. 1A;

FIGS. 26B through 29B show a method of fabricating a semiconductor device according to still further example embodiments of the inventive concepts and are sectional views taken along yz-plane in FIG. 1A;

Figure 1A:
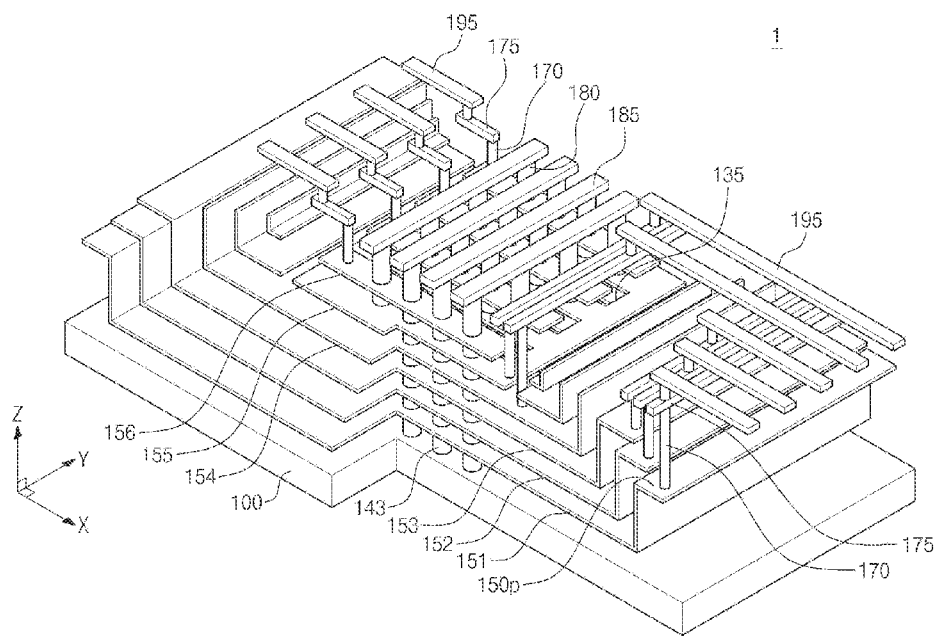
FIG. 1A is a perspective view of a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[Structure: Example Embodiments]

Figure 1B:
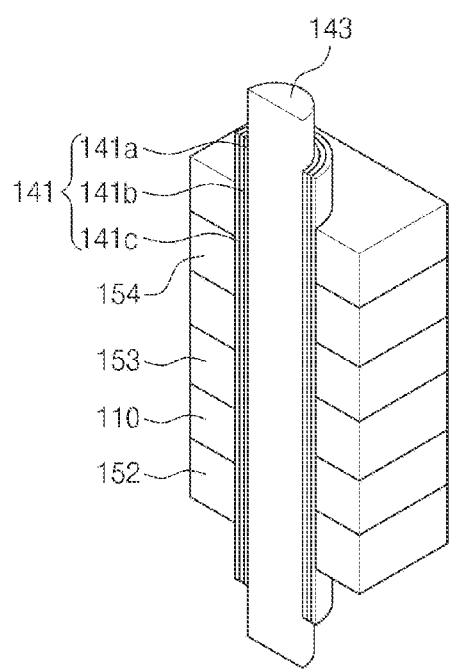
FIGS. 1B through 1D are enlarged perspective views of a portion of the semiconductor device shown in FIG. 1A.
Figure 1C:
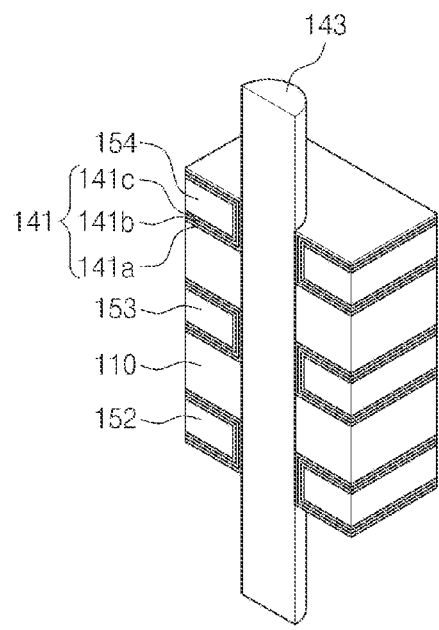
Figure 1D:
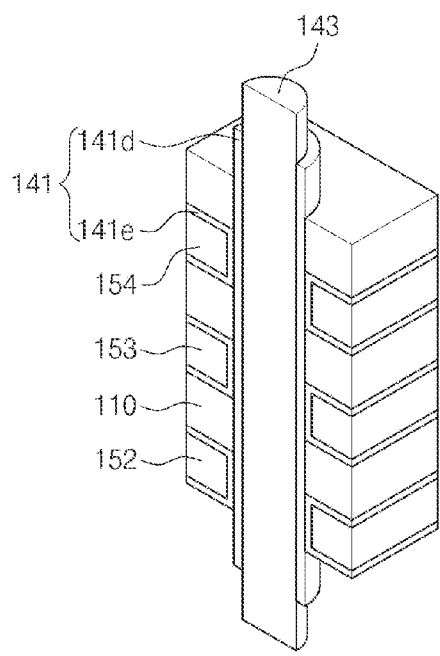

FIG. 1A is a perspective view of a semiconductor device according to example embodiments of the inventive concepts, and FIGS. 1B through 1D are enlarged perspective views of a portion of the semiconductor device shown in FIG. 1A.

Referring to FIG. 1A, a semiconductor device 1 may be a vertical NAND FLASH memory device including a plurality of conductive layers 151-156 stacked on a substrate 100 along a vertical direction or Z direction, a plurality of vertical channels 143 vertically penetrating the conductive layers 151-156 and electrically connected to the substrate 100, and a plurality of bit lines 185 extending along a Y direction and electrically connected to the vertical channels 143 via metal contact plugs 180. The lowermost one of the conductive layers 151-156 (or a first conductive layer 151) may serve as a ground selection line GSL, the uppermost one thereof (or a sixth conductive layer 156) may serve as a string selection line SSL, second to fifth conductive layers 152-155 interposed between the first and sixth conductive layers 151 and 156 may serve as word lines WL. The sixth conductive layer 156 may be shaped like a line extending along an X direction, and the first to fifth conductive layers 151-155 may be shaped like a comb with word-line cut regions 135 or a plate without the word-line cut regions 135.

The semiconductor device 1 may further include metal interconnection lines 175 and 195 electrically connecting the conductive layers 151-156 with driving circuits (not shown). The metal interconnection lines 175 may be connected to the conductive layers 151-156 via metal contact plugs 170. From a sectional view, the conductive layers 151-156 may have a sharply or gently curved shape. For instance, at least one of the first to third conductive layers 151-153 may include stepwise curved end portions, and at least one of the fourth to sixth conductive layers 154-156 may include 'L'-shaped end portions. Stated another way, the first to third conductive layers 151-153 have a stair shaped cross-section, and the fourth to sixth conductive layers 154-156 have an L-shaped cross-section. In this embodiment, the riser of the stair shaped cross-section is perpendicular to the runner of the stair shaped cross-section. Similarly, the L-shaped cross-section also forms a substantially 90 degree angle. Although not depicted in FIG. 1A, the conductive layers 151-156 may include the stepwise curved end portions in both of X and Y directions.

Each of the conductive layers 151-156 may include a portion (hereinafter, a contact area or contact area 150p) for a connection with the metal contact plug 170, as depicted in FIGS. 9A, 10A, 11A, 11C, and 11D. In some embodiments, some of the conductive layers 151-156 (e.g., the first to third conductive layers 151-153) may include the contact area 150p located at the same level as those of the others (e.g., the fourth to sixth conductive layers 154-156), respectively. For instance, the contact area 150p of the first conductive layer 151 may be located at the substantially same level as that of the fourth conductive layer 154, and the contact area 150p of the second conductive layer 152 may be located at the substantially same level as that of the fifth conductive layer 155, and the contact area 150p of the third conductive layer 153 may be located at the substantially same level as that of the sixth conductive layer 156. That is, lower ones of the conductive layers (i.e., the first to third conductive layers 151-153) may have the contact areas 150p provided at elevated levels, and this enables to simplify a process for forming the metal contact plugs 170. Furthermore, this enables to simplify a process for forming the stepwise portions or the contact areas 150p. The simplification of the processes for forming the metal contact plugs 170 and the contact areas 150p may be understood with reference to a method of fabricating a semiconductor device presented below.

In the semiconductor device 1, a memory layer 141 serving as an information storing element may be realized in various manners. For instance, as shown in FIG. 1B, the memory layer 141 may extend along the vertical channel 143 to surround the vertical channel 143. The memory layer 141 may include a tunnel layer 141a adjacent to the vertical channel 143, a blocking layer 141c adjacent to the conductive layers 152-154, and a trap insulating layer 141b interposed between the tunnel layer 141a and the blocking layer 141c.

Alternatively, as shown in FIG. 1C, the memory layer 141 may include a vertical portion and at least one horizontal portion extending from the vertical portion, where the vertical portion may be interposed between the vertical channel 143 and the conductive layers 152-154 and the horizontal portion may be interposed between the conductive layers 152-154 and insulating layers 110, which separate the conductive layers. In other embodiments, as shown in FIG. 1D, the memory layer 141 may include a first memory layer 141d surrounding the vertical channel 143 and a second memory layer 141e surrounding the conductive layers 152-154. Here, the first memory layer 141d may include the tunnel layer, the second memory layer 141e may include the blocking insulating layer, and the trap insulating layer may be incorporated in the first memory layer 141d or the second memory layer 141e.

[Structure: Other Example Embodiments]

Figure 2A:
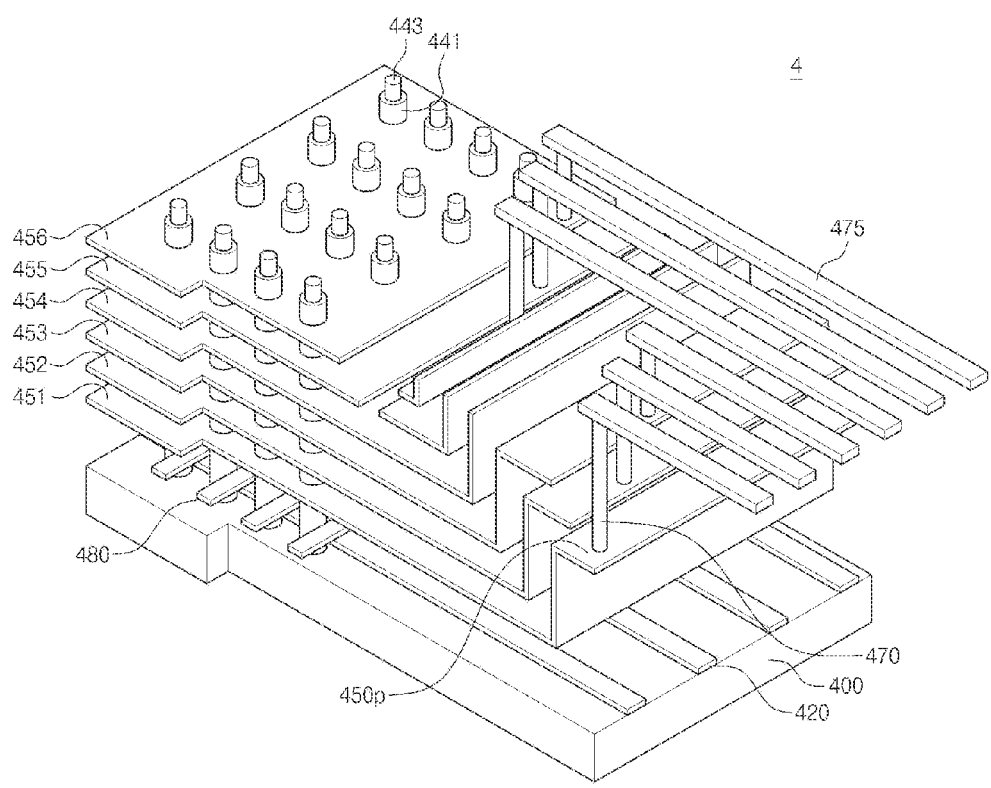
FIG. 2A is a perspective view of a semiconductor device according to other example embodiments of the inventive concepts.

FIG. 2A is a perspective view of a semiconductor device according to other example embodiments of the inventive concepts.

Referring to FIG. 2A, a semiconductor device 4 may be a resistive memory device including word lines 420 provided on a substrate 400, bit lines 480 crossing over the word lines 420, a plurality of source lines 451-456 stacked over the bit lines 480, electrodes 443 vertically penetrating the source lines 451-456 to be electrically connected to the substrate 400, and variable resistance layers 441 surrounding the electrodes 443. The variable resistance layer 441 may include a material exhibiting two or more reversibly stable resistance states (for instance, metal oxides, metal nitrides, Perovskite oxides, or solid electrolytes containing metal ions). Alternatively, the variable resistance layer 441 may include a material (e.g., chalcogenide compounds), whose crystallographic structure can be reversibly switched between a high-resistance amorphous state and a low-resistance crystalline state.

The semiconductor device 4 may further include metal contact plugs 470 and metal interconnection lines 475, which may be used to electrically connect the source lines 451-456 with driving circuits (not shown). Each of the source lines 451-456 may include a portion (hereinafter, a contact area 450p) for a connection with the metal contact plug 470. Lower ones of the source lines 451-456 (for instance, first to third source lines 451-453) may include end portions having a stepwise shape and serving as the contact area 450p, and the contact areas 450p of the first to third source lines 451-453 may be located at the substantially same level as those of fourth to sixth source lines 454-456, respectively. For instance, the contact area 450p of the first source line 451 may be located at the substantially same level as that of the fourth source line 454, and the contact area 450p of the second source line 452 may be located at the substantially same level as that of the fifth source line 455, and the contact area 450p of the third source line 453 may be located at the substantially same level as that of the sixth source line 456. As a result, some of the metal contact plugs 470 connected to the first to third source lines 451-453 may be formed simultaneously with the others of the metal contact plugs 470 connected to the fourth to sixth source lines 454-456. In some embodiments, the contact areas 450*p* of the fourth to sixth source lines 454-456 may be simultaneously defined during forming the stepwise contact areas 450*p* of the first to third source lines 451-453.

[Structure: Still Other Example Embodiments]

Figure 2B:
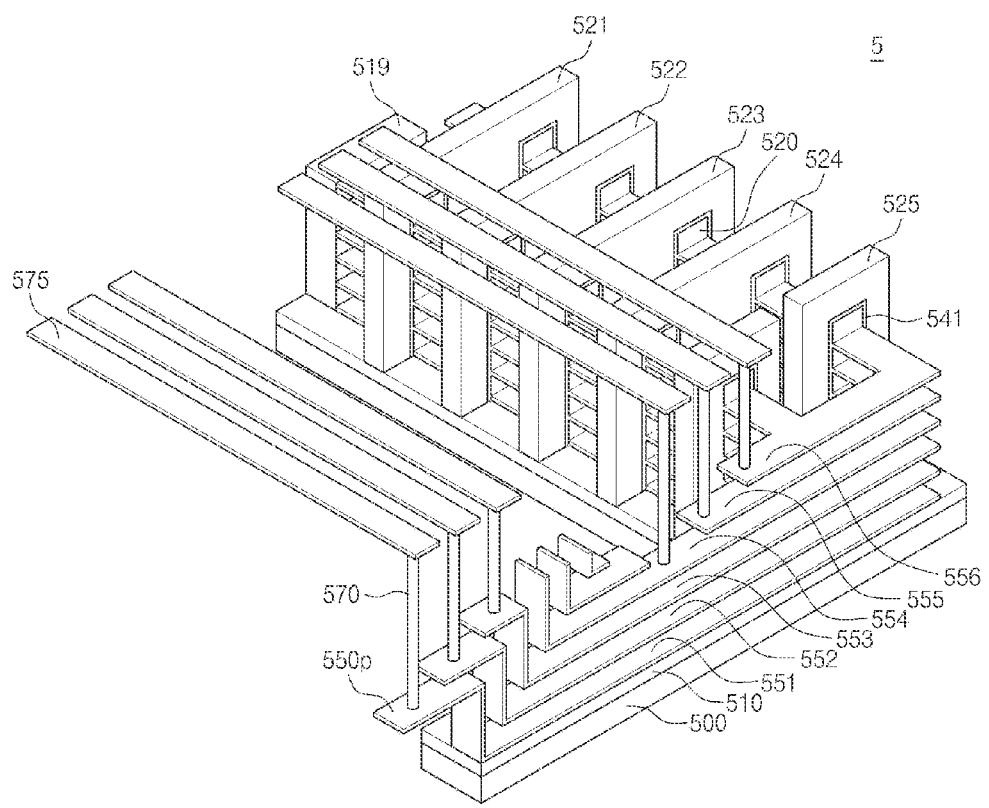
FIG. 2B is a perspective view of a semiconductor device according to still other example embodiments of the inventive concepts.

FIG. 2B is a perspective view of a semiconductor device according to still other example embodiments of the inventive concepts.

Referring to FIG. 2B, a semiconductor device 5 may be a three-dimensional semiconductor memory device including a plurality of conductive layers 521-525 provided on a substrate 500 to have a comb shape, a plurality of conductive strips 551-556 stacked on the substrate 500 to cross the conductive layers 521-525, a plurality of memory layers 541 interposed between the conductive layers 521-525 and the conductive strips 551-556, and a plurality of bit lines 575 electrically connected to the conductive strips 551-556. In some embodiments, an insulating layer 510 may be disposed between the substrate 500 and the conductive strip 551. One of the conductive layers 521-525 (e.g., a first conductive layer 521) may serve as a ground selection line GSL, another of the conductive layers 521-525 (e.g., a fifth conductive layer 525) may serve as a string selection line SSL, and at least one of the remainders (e.g., second to fourth conductive layers 522-524) may serve as word lines WL. Each of the conductive strips 551-556 may include a drain portion, which is electrically connected to the corresponding one of the bit lines 575 via a metal contact plug 570, and a source portion connected in common to a common source line 519. From a plan view, the conductive layers 521-525 may be disposed between the source and drain portions of the conductive strips 551-556. The memory layer 541 may include a single-layered insulating structure (e.g., of SiN) or a multi-layered insulating structure (e.g., of oxide-nitride-oxide). The conductive strips 551-556 may serve as channel regions of transistors or an active region of active devices and be electrically separated from each other by interlayer dielectrics 520 interposed therebetween.

Each of the conductive strips 551-556 may include a portion (hereinafter, a contact area 550*p*) for a connection with the metal contact plug 570. Lower ones of the conductive strips 551-556 (for instance, first to third conductive strips 551-553) may include end portions having a stepwise shape and serving as the contact areas 550*p*. That is, the first to third conductive strips 551-553 may be configured to have the contact areas 550*p* provided at elevated levels. In some embodiments, the first to third conductive strips 551-553 may include the contact areas 550*p* located at the same level as those of the others (e.g., the fourth to sixth conductive strips 554-556), respectively.

In other embodiments, the common source line 519 may be configured to include a plurality of source lines stacked on the substrate 500, and the source lines may be arranged to have the same or similar configuration or shape as the conductive strips 551-556. For instance, at least one of the source lines may include a stepwise and/or 'L'-shaped portion, like as the contact areas 550*p* of the conductive strips 551-556.

[Fabricating Method: Example Embodiments]

FIGS. 3A through 11A and FIGS. 3B through 11B show a method of fabricating a semiconductor device according to example embodiments of the inventive concepts. FIGS. 3A through 11A are sectional views taken along xz-plane in FIG. 1A, and FIGS. 3B through 11B are sectional views taken along yz-plane in FIG. 1A.

Figure 3A:
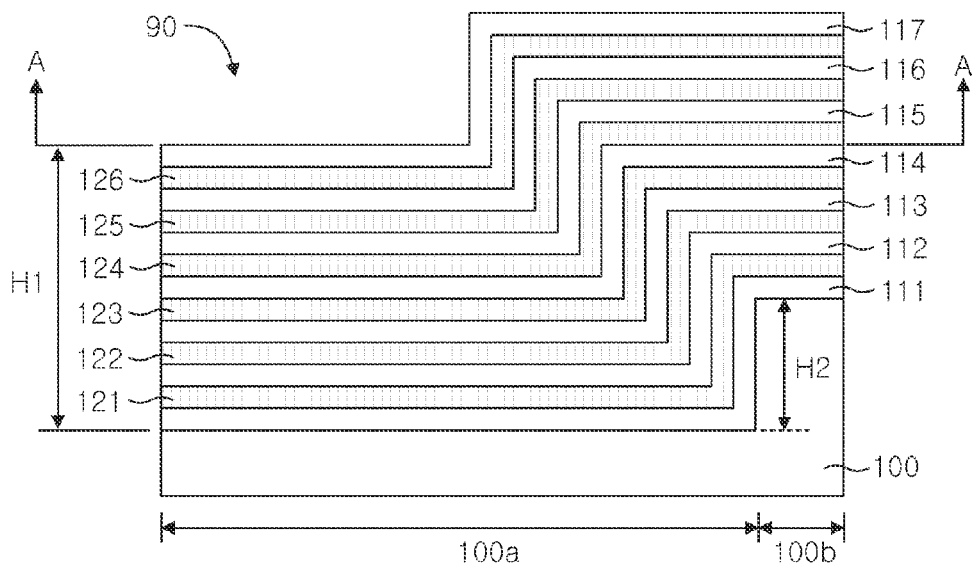
Figure 3B:
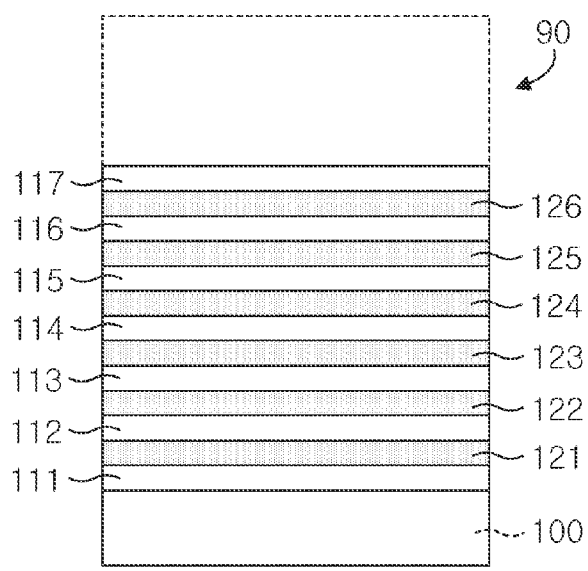

Referring to FIGS. 3A and 3B, a plurality of insulating layers 111-117 and a plurality of sacrificial layers 121-126 may be alternatingly stacked on a substrate 100 to form a mold stack 90. For instance, first to seventh insulating layers 111-117 and first to sixth sacrificial layers 121-126 may be alternatingly and conformably stacked on the substrate 100 having a stepwise or terraced structure. Alternatively, the insulating layers 111-117 may be formed of a material having an etch selectivity with respect to the sacrificial layers 121-126, or vice versa. For instance, the insulating layers 111-117 may be formed of a silicon oxide (SiOx) layer, and the sacrificial layers 121-126 may be formed of a silicon nitride (SiNx) layer. The substrate 100 may be configured to have the stepwise or terraced structure, as described above; for instance, the substrate 100 may be a silicon wafer including a recess region 100*a* and a circumference region 100*b* thicker than the recess region 100*a*. The recess region 100*a* may be formed by anisotropically etching the substrate 100. In some embodiments, a vertical thickness H2 of the circumference region 100*b* may be equivalent to half of a vertical thickness H1 of the mold stack 90, but example embodiments of the inventive concepts may not be limited thereto.

Figure 4A:
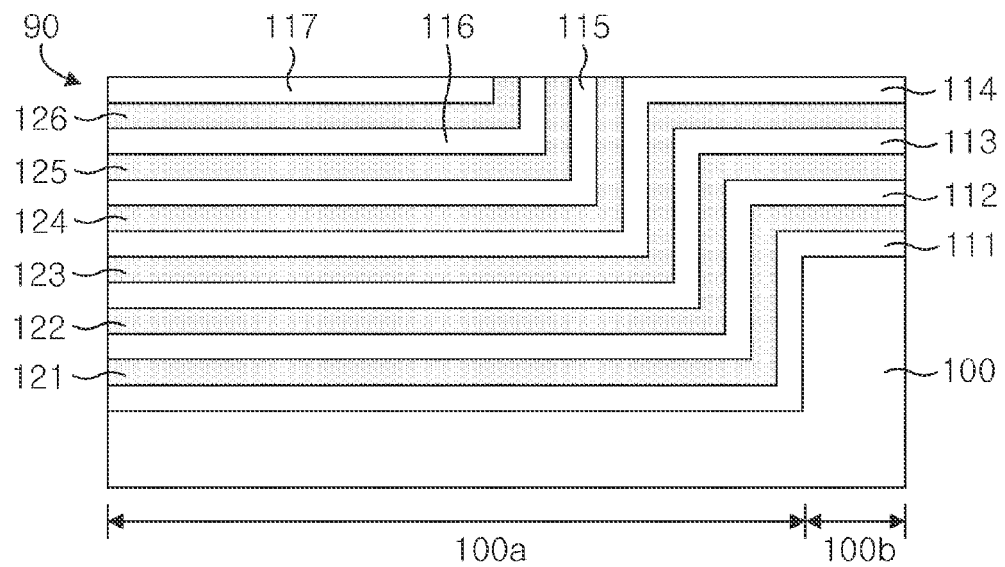
Figure 4B:
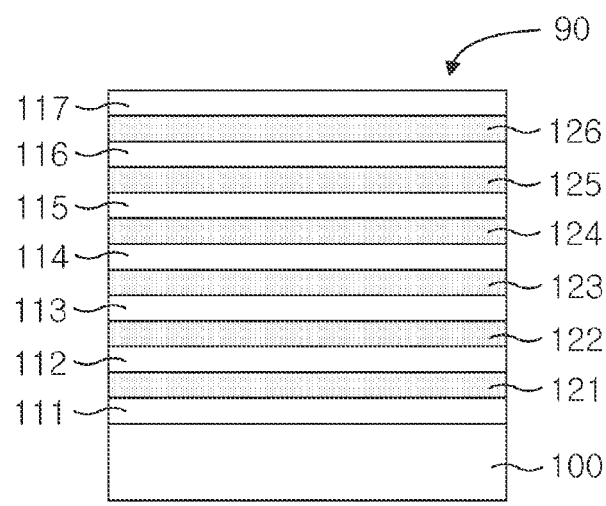

Referring to FIGS. 4A and 4B, the mold stack 90 may be planarized using, for instance, a chemical mechanical polishing process. In some embodiments, the planarization may be performed to leave the uppermost layer of the mold stack 90 on the recess region 100*a* or to remove an upper half of the mold stack 90 on the circumference region 100*b*, as depicted by a line A-A' of FIG. 3A. In this case, the fourth to sixth sacrificial layers 124-126 may be partially removed to have 'L'-shaped end portions. That is, the resultant mold stack 90 may include the stepwise or stair-shaped first to third sacrificial layers 121-123 and the 'L'-shaped fourth to sixth sacrificial layers 124-126, which are stacked on the substrate 100. The planarization of the mold stack 90 may be performed using various methods, as will be described below. Furthermore, the planarization may be performed such the sixth sacrificial layer 126 has a linear cross-section (e.g., is planar).

Figure 5A:
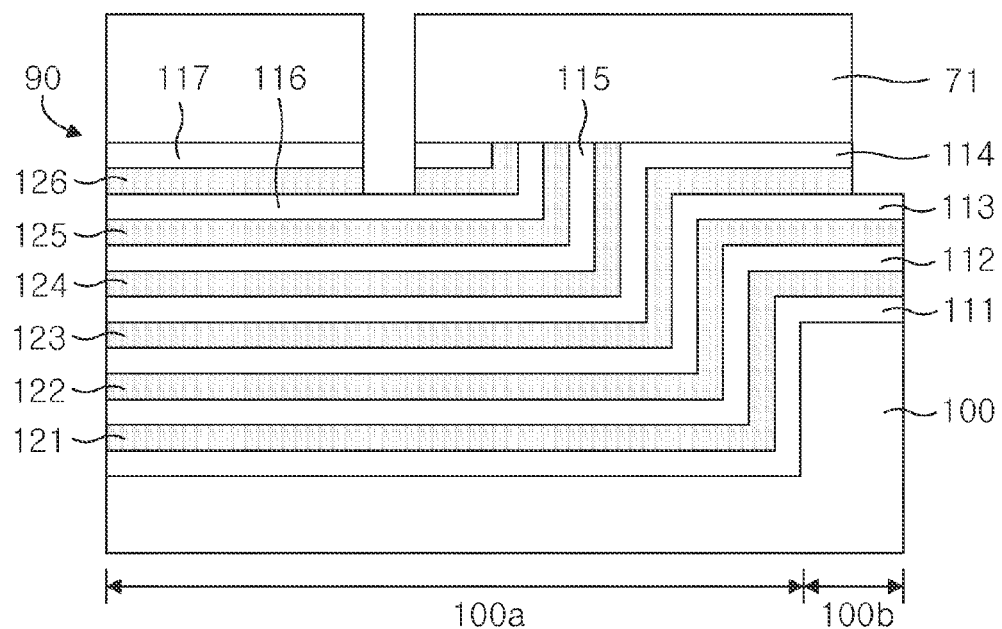
Figure 5B:
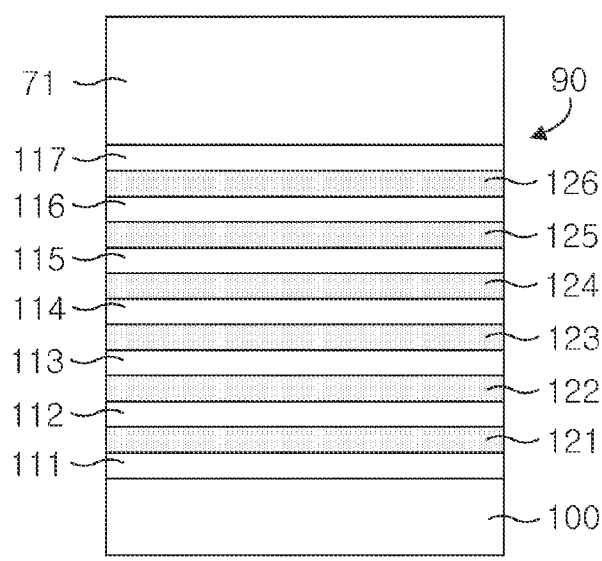

Referring to FIGS. 5A and 5B, the mold stack 90 may be firstly patterned using a first mask 71 as an etch mask. The formation of the first mask 71 may include coating a photoresist film on the mold stack 90 and patterning the photoresist film to expose at least two regions of the mold stack 90 (for instance, to partially expose the recess region 100*a* and the circumference region 100*b*). The first patterning of the mold stack 90 may be performed to etch the seventh insulating layer 117 and the sixth sacrificial layer 126 on the recess region 100*a* and to etch the fourth insulating layer 114 and the third sacrificial layer 123 on the circumference region 100*b*.

Figure 6A:
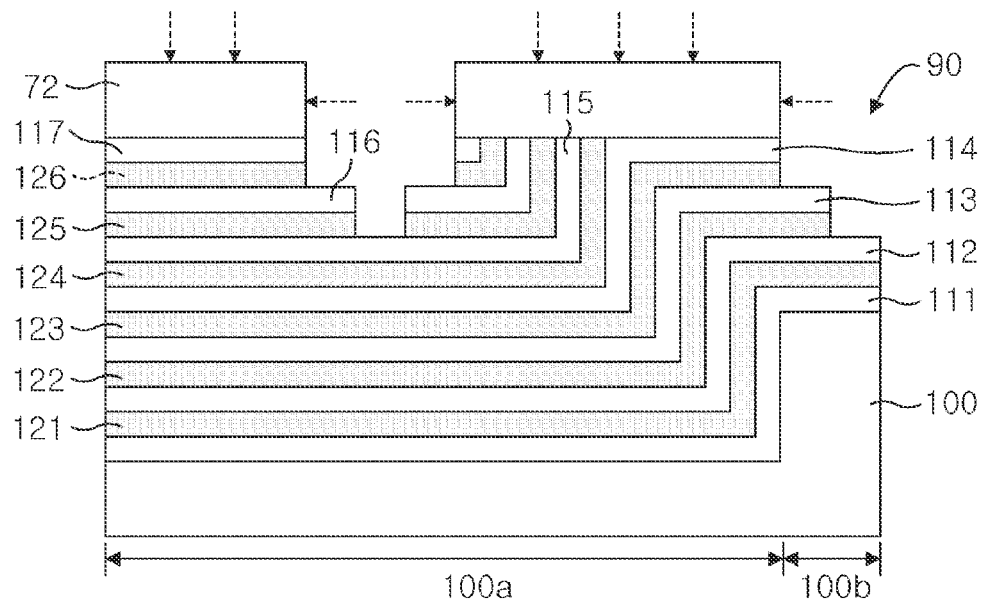
Figure 6B:
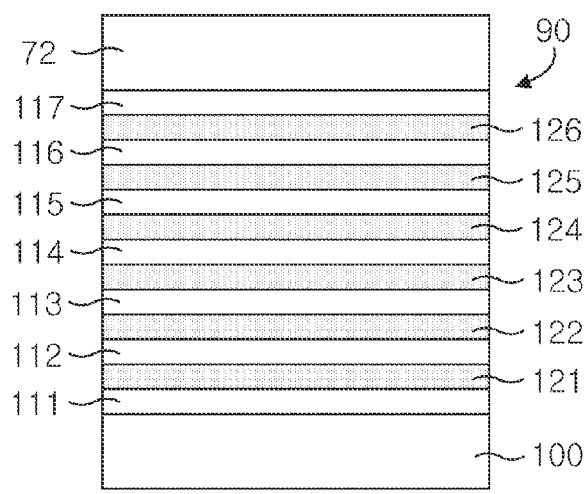

Referring to FIGS. 6A and 6B, the mold stack 90 may be secondly patterned using a second mask 72 as an etch mask. The second mask 72 may be formed by a trimming process shrinking the first mask 71. The second patterning of the mold stack 90 may be performed to etch portions of the sixth and seventh insulating layers 116 and 117 and portions of the fifth and sixth sacrificial layers 125 and 126, which are newly exposed by the trimming process, on the recess region 100*a*, and simultaneously, to etch portions of the third and fourth insulating layers 113 and 114 and portions of the second and third sacrificial layers 122 and 123, which are newly exposed by the trimming process, on the circumference region 100*b*.

According to the afore-described embodiments, the mold stack 90 may have stepwise structures, which may be simultaneously formed at both of the recess and circumference regions 100*a* and 100*b* by the one-time etching process. Hereinafter, this patterning process will be called a 'terracing process'. That is, in the case that the insulating and sacrificial layers are stacked on the stepwise substrate 100, the terracing process can be simplified, compared with the case that the insulating and sacrificial layers are stacked on a flat substrate. For instance, when the mold stack 90 includes seven insulating layers and six sacrificial layers as shown in FIG. 3A, the terracing process should be performed two times in the case of the stepwise substrate 100, while it should be performed five times in the case of the flat substrate.

Figure 7A:
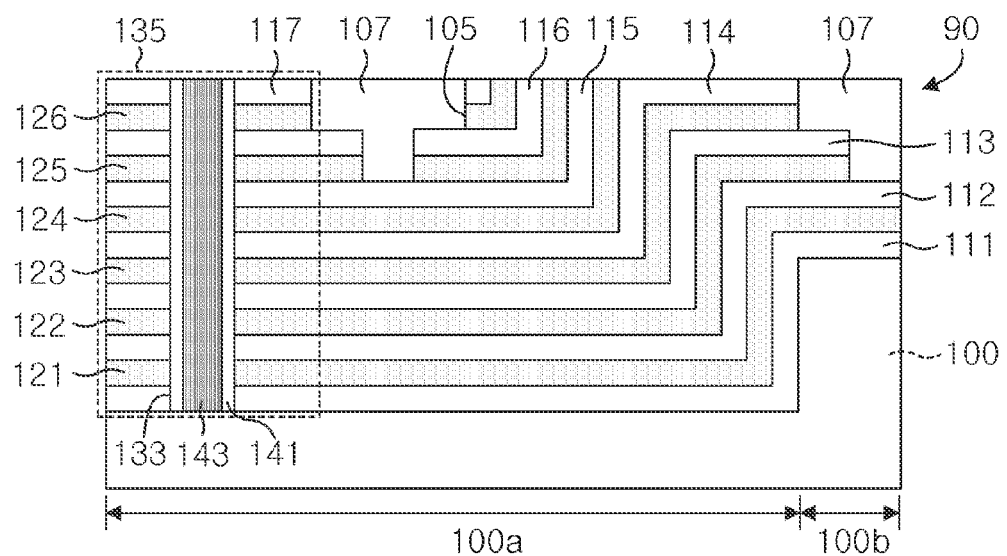
Figure 7B:
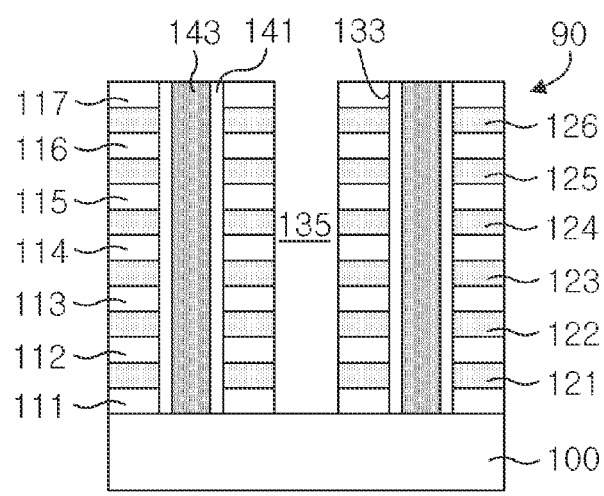

Referring to FIGS. 7A and 7B, the second mask 72 may be removed by an ashing process, and then, open regions 105 presented by the terracing process may be filled with a capping insulating layer 107 (e.g., of silicon oxide (SiOx)). Thereafter, vertical channels 143 penetrating the mold stack 90 may be formed to be electrically connected to the substrate 100 and memory layers 141 surrounding the vertical channels 143 may be formed. For instance, the formation of the vertical channels 143 may include anisotropically etching the mold stack 90 to form vertical holes 133 exposing the substrate 100, and then filling the vertical holes 133 with the same or equivalent material (e.g., a deposited or epitaxially grown silicon layer) as the substrate 100. The memory layers 141 may be formed using a deposition process, before the formation of the vertical channels 143. Each of the memory layers 141 may include, as shown in FIG. 1B, a tunnel layer (e.g., of SiOx) adjacent to the vertical channel 143, a blocking layer (e.g., of SiOx or AlOx) adjacent to the insulating layers 111-117 and the sacrificial layers 121-126, and a trap insulating layer (e.g., of SiNx) interposed between the tunnel and blocking layers. In some embodiments, the formation of the vertical channels 143 may be performed before or after the terracing process. In some embodiments, word-line cut regions 135 may be formed between the vertical channels 143 to expose the substrate 100 or the first insulating layer 111. As the result of the formation of the word-line cut regions 135, the seventh insulating layer 117 and the sixth sacrificial layer 126 may be separated into a plurality of lines.

Figure 8A:
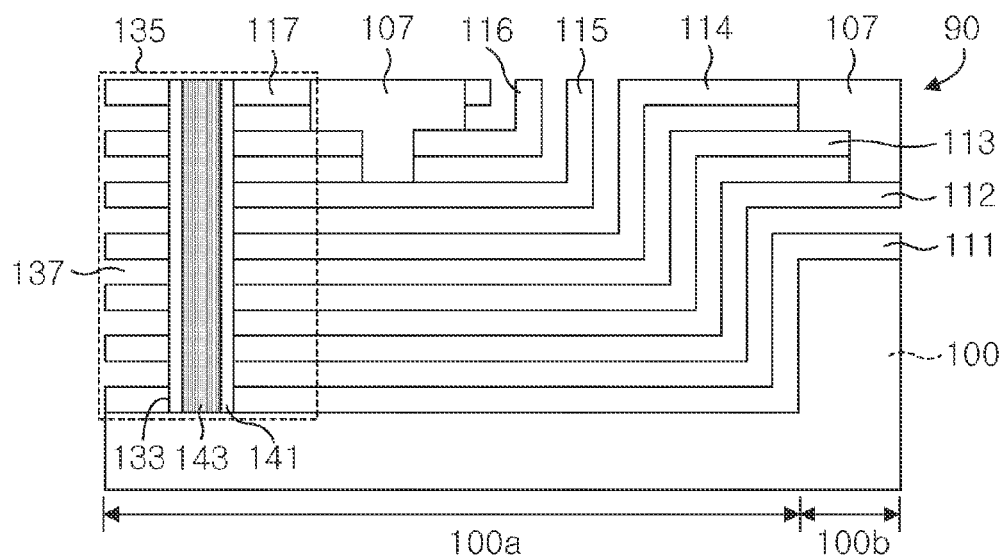
Figure 8B:
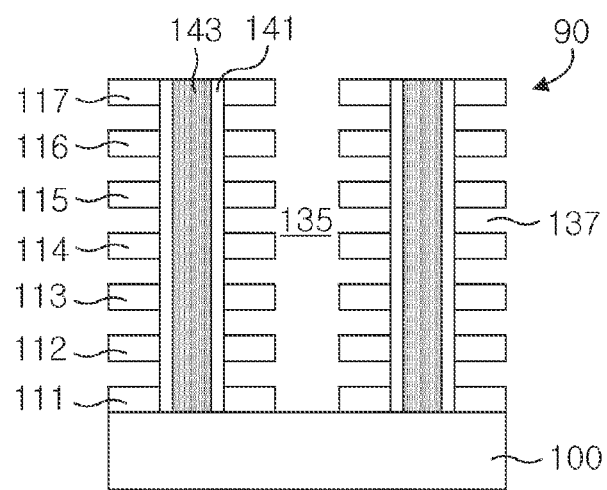

Referring to FIGS. 8A and 8B, the sacrificial layers 121-126 may be removed by supplying an etchant (e.g., $H_3PO_4$) capable of selectively etching the sacrificial layers 121-126 through the word-line cut region 135. As the result of the removal of the sacrificial layers 121-126, evacuated regions 137 may be formed between the insulating layers 111-117 and the memory layer 141 may be exposed via the evacuated regions 137. The evacuated regions 137 may have a curved stepwise profile originated from a transcription of a top surface profile of the substrate 100. According to the afore described embodiments, some of the evacuated regions 137 may be separated into two regions by the capping insulating layer 107 provided between the seventh and sixth insulating layers 117 and 116 and between sixth and fifth insulating layers 116 and 115.

Figure 9A:
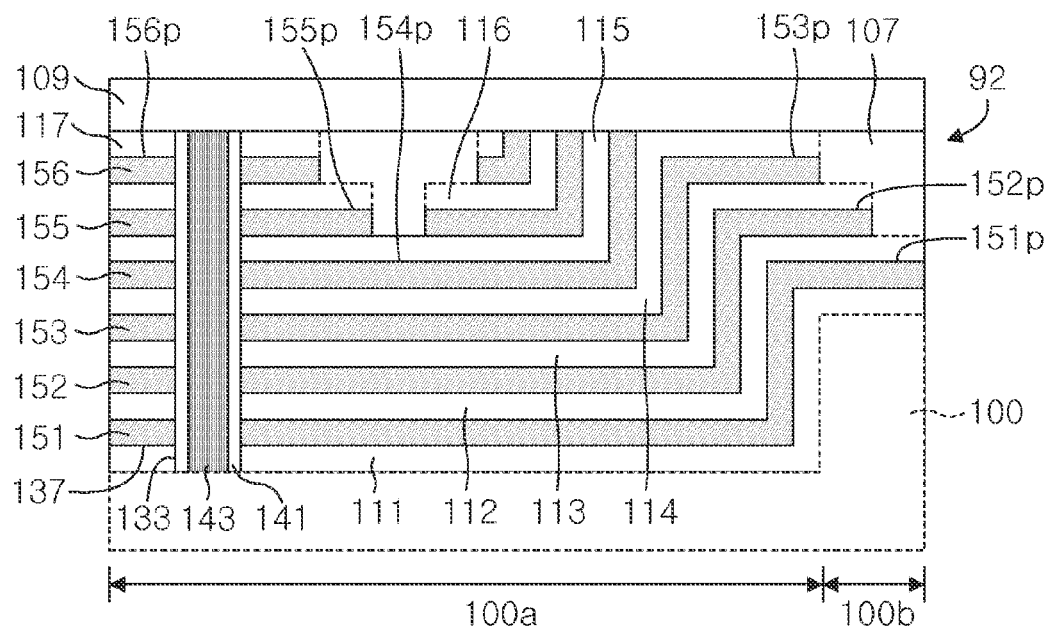
Figure 9B:
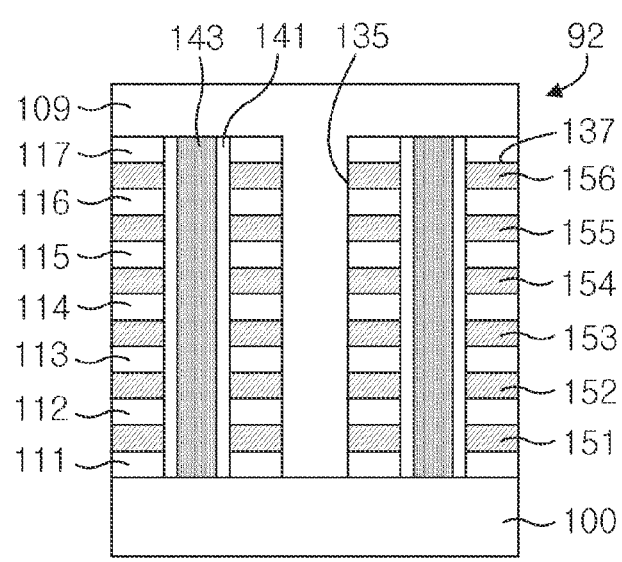

Referring to FIGS. 9A and 9B, first to sixth conductive layers 151-156 may be formed to fill the evacuated regions 137. The formation of the first to sixth conductive layers 151-156 may include depositing a conductive layer to fill the evacuated regions 137 and etching the conductive layer to re-open the word-line cut regions 135. The first to sixth conductive layers 151-156 may be stacked on the substrate 100 to form a gate stack 92 including a stepwise portion. Thereafter, a gap-fill insulating layer 109 (e.g., of silicon oxide) may be formed on the gate stack 92 to fill the re-open word-line cut regions 135. That is, the resultant gate stack 90 may include the stepwise or stair-shaped first to third conductive layers 151-153 and the 'L'-shaped fourth to sixth conductive layers 154-156. Furthermore, as discussed above, the sixth sacrificial layer 126 may have a linear cross-section (e.g., is planar) such that the sixth conductive layer 156 also has a linear cross-section. In some embodiments, the first conductive layer 151 may include an end portion that is not covered with the second conductive layer 152, and this end portion may serve as a contact area 151p, allowing a connection with a metal contact plug 170 described with reference to FIG. 11A. Similarly, the second and third conductive layers 152 and 153 may include end portions serving as contact areas 152p and 153p. Each of the fifth and sixth conductive layers 155 and 156 may include two portions horizontally separated by the capping insulating layer 107, and ones of the separated portions, adjacent to the vertical channel 143, may serve as contact areas 155p and 156p for the connection with the metal contact plug 170. The fourth conductive layer 154 may include a portion that is not covered with the fifth conductive layer 155 and is located under the capping insulating layer 107, and this portion may serve as a contact area 154p. According to the afore-described embodiments, the contact areas 154p-156p on the recess region 100a may be respectively formed at the same or equivalent level as the contact areas 151p-153p on the circumference region 100b. For instance, the contact area 151p of the first conductive layer 151 may be formed at the same or equivalent level as the contact area 154p of the fourth conductive layer 154, the contact area 152p of the second conductive layer 152 may be formed at the same or equivalent level as the contact area 155p of the fifth conductive layer 155, and the contact area 153p of the third conductive layer 153 may be formed at the same or equivalent level as the contact area 156p of the sixth conductive layer 156. It will be appreciated that the same or equivalent level in this disclosure should be interpreted as substantially the same or equivalent level because some small margin of difference may occur from variations in the manufacturing process. Accordingly, the mentioned contact areas are at substantially the same level within manufacturing tolerances. Hereinafter, for concise description, the contact areas 151p-156p of the first to sixth conductive layers 151-156 will be called 'contact areas 150p', and a term 'insulating layer 110' will be used to commonly indicate the first to seventh insulating layer 111-117, the capping insulating layer 107, and the gap-fill insulating layer 109, as shown in FIG. 10A.

Figure 10A:
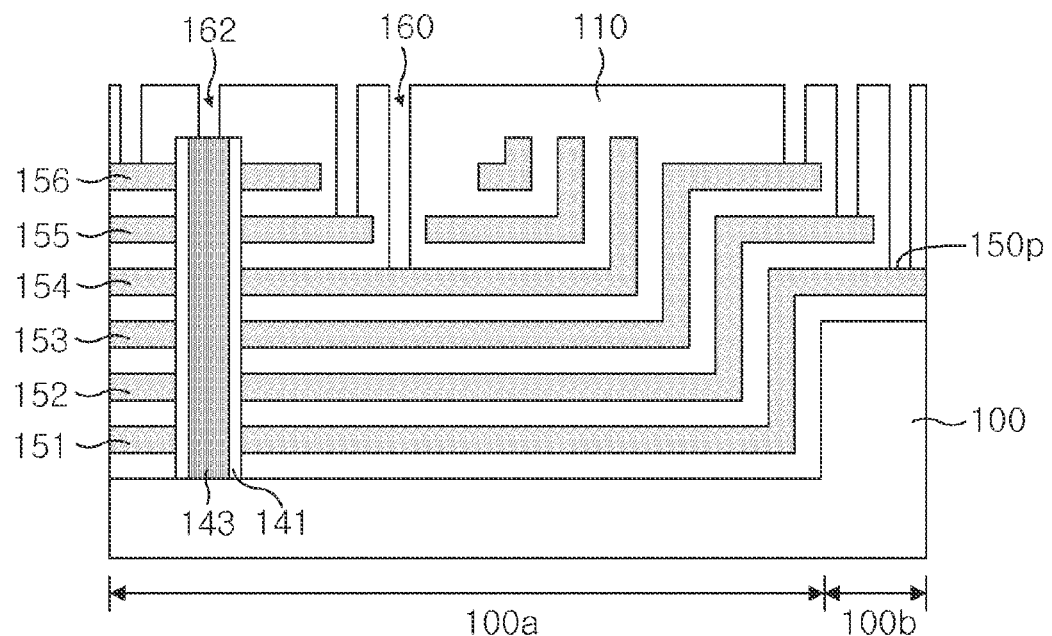
Figure 10B:
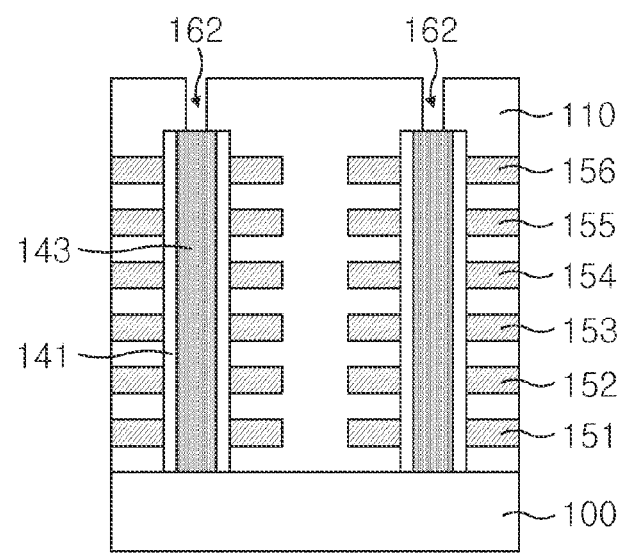

Referring to FIGS. 10A and 10B, the insulating layer 110 may be patterned to form a plurality of contact holes 160 exposing the contact areas 150p. In some embodiments, the contact holes 160 may be simultaneously formed using the same patterning process, unless the contact holes 160 have significant difference in depth. For instance, the contact holes 160 exposing the contact areas 150p of the first to third conductive layers 151-153 may be formed by a one-time anisotropic etching process. According to the afore-described embodiments, the contact area 150p of the first conductive layer 151 may be located at the same or equivalent level as the contact area 150p of the fourth conductive layer 154. And the contact areas 150p of the second and fifth conductive layers 152 and 154 may be located at the same or equivalent level as each other, and the contact areas 150p of the third and sixth conductive layers 153 and 156 may be located at the same or equivalent level as each other.

As a result, the contact holes 160 exposing the contact areas 150p of the first to third conductive layers 151-153 and the fourth to sixth conductive layers 154-156 can be simultaneously formed by the same anisotropic etch process. In the case that the first to sixth conductive layers 151-156 are stacked on a flat substrate, not on the stepwise substrate 100, two or more anisotropic etching processes may be required to form the contact holes 160 exposing the contact areas 150p of the first to sixth conductive layers 151-156. By contrast, in the afore-described embodiments, the contact holes 160 can be simultaneously formed by the same and single anisotropic etch process as described above, and thus, it is possible to reduce the time of etching process. In some embodiments, bit line contact holes 162 exposing the vertical channels 143 may be formed during the formation of the contact holes 160.

Figure 11A:
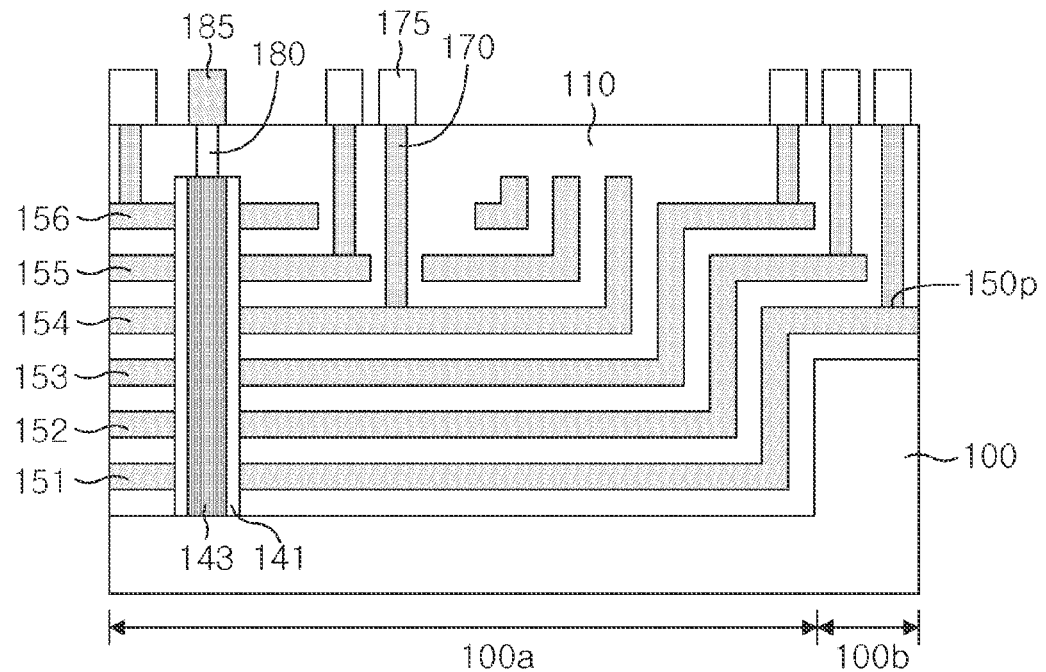
Figure 11B:
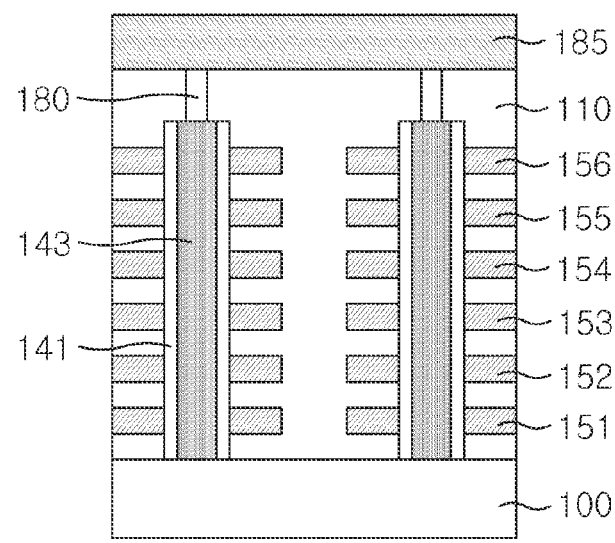

Referring to FIGS. 11A and 11B, metal contact plugs 170 may be formed to fill the contact holes 160. In some embodiments, the metal contact plugs 170 may be simultaneously formed using the same process, and furthermore, bit line contact plugs 180 filling the bit line contact holes 162 may be formed during the formation of the metal contact plugs 170. Metal interconnection lines 175 may be formed on the insulating layer 110 and be connected to the metal contact plugs 170. In some embodiments, the first conductive layer 151 may serve as a ground selection line GSL, the second to fifth conductive layers 152-155 may serve as word lines WL, and the sixth conductive layer 156 may serve as a string selection line SSL. Some of the metal interconnection lines 175 may be configured to electrically connect the first conductive layer 151 with a driving circuit (not shown) for controlling an electric potential of the ground selection line. Others of the metal interconnection lines 175 may be configured to electrically connect the second to fifth conductive layers 152-155 with driving circuits (not shown) for controlling electric potentials of the word lines. The other of the metal interconnection lines 175 may be configured to electrically connect the sixth conductive layer 156 with a driving circuit (not shown) for controlling an electric potential of the string selection line. Metal interconnection lines 185 may be formed on the bit line contact plugs 180, and second metal interconnection lines 195 may be formed on the metal interconnection lines 185. As shown in FIG. 1A, the metal interconnection lines 185 may be electrically connected to the bit line contact plugs 180 to serve as bit lines BL, and the second metal interconnection lines 195 may be electrically connected to the metal interconnection lines 175.

Because of the stair shaped and L-shaped conductive layers 151-156, a lower conductive layer (e.g., conductive layer 152) disposed below an upper conductive layer (e.g., conductive layer 154) in the recess region 100a has a contact area higher than the contact area of the upper conductive layer. For example, the conductive layer 152 is disposed below the conductive layer 154 in the recess region 100a, but has a contact area higher than the contact area of the conductive layer 154. Similarly, the conductive layer 153 is disposed below the conductive layer 155 in the recess region 100a, but has a contact area higher than the contact area of the conductive layer 155. And, as shown, the conductive layer 155 has a contact area at substantially a same level as the conductive layer 152.

[Fabricating Method: Modified Example Embodiments]

Figure 11C:
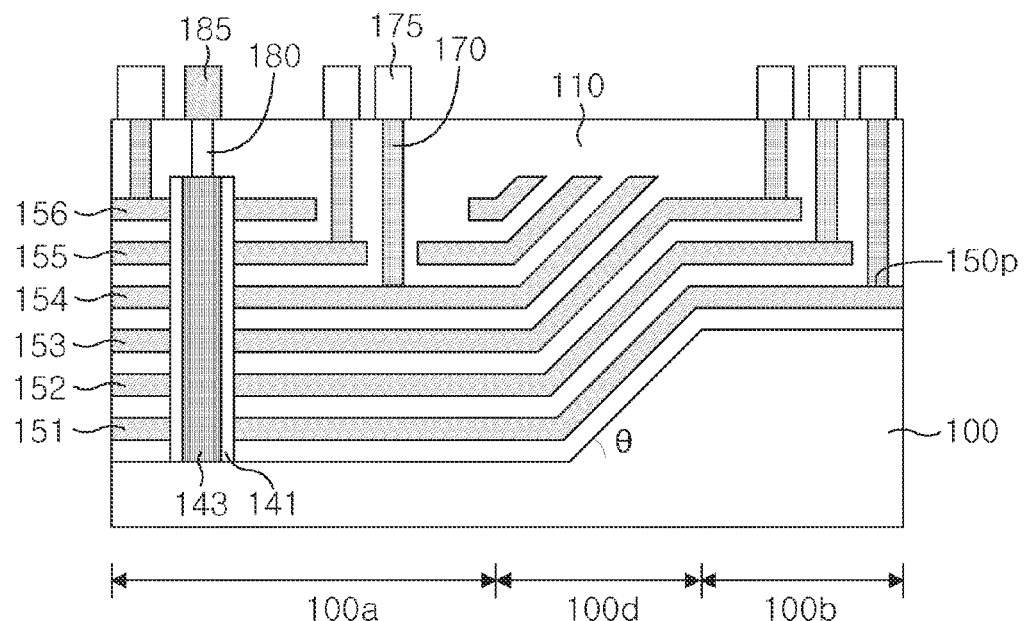
FIGS. 11C and 11D are sectional views of semiconductor devices according to embodiments modified from that illustrated in FIG. 11A.

Referring to FIG. 11C, a terraced substrate 100 may further include a sloping region 100d disposed between the recess region 100a and the circumference region 100b. On the sloping region 100d, the terraced substrate 100 may have a surface slanted at an angle θ of about 0° to about 90° relative to a top surface of the substrate 100 on the recess region 100a. The conductive layers 151-156 may include sloping portions originated from the sloping region 100d of the terraced substrate 100. Namely, the riser and runner of the stair shaped cross-section forms greater than a 90 degree angle.

Figure 11D:
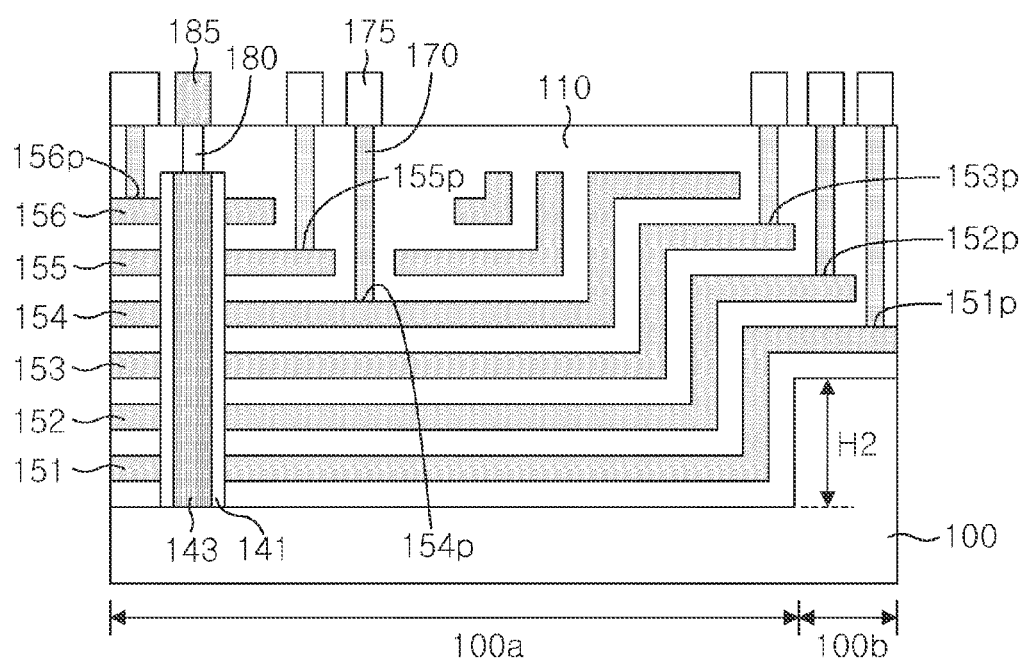

Referring to FIG. 11D, levels of the contact areas 151p-156p may be dependent on the vertical height H2 of the circumference region 100b. By using this, the contact areas 154p-156p on the recess region 100a can be located at levels different from the contact areas 151p-153p on the circumference region 100b, unlike shown in FIG. 9A. For instance, the contact area 151p of the first conductive layer 151 may be located at a lower level than the contact area 154p of the fourth conductive layer 154. The contact area 152p of the second conductive layer 152 may be located at a level higher than the contact area 154p of the fourth conductive layer 154 and lower than the contact area 155p of the fifth conductive layer 155. The contact area 153p of the third conductive layer 153 may be located at a level higher than the contact area 155p of the fifth conductive layer 155 and lower than the contact area 156p of the sixth conductive layer 156.

[Fabricating Method: Peripheral Circuits]

Figure 12A:
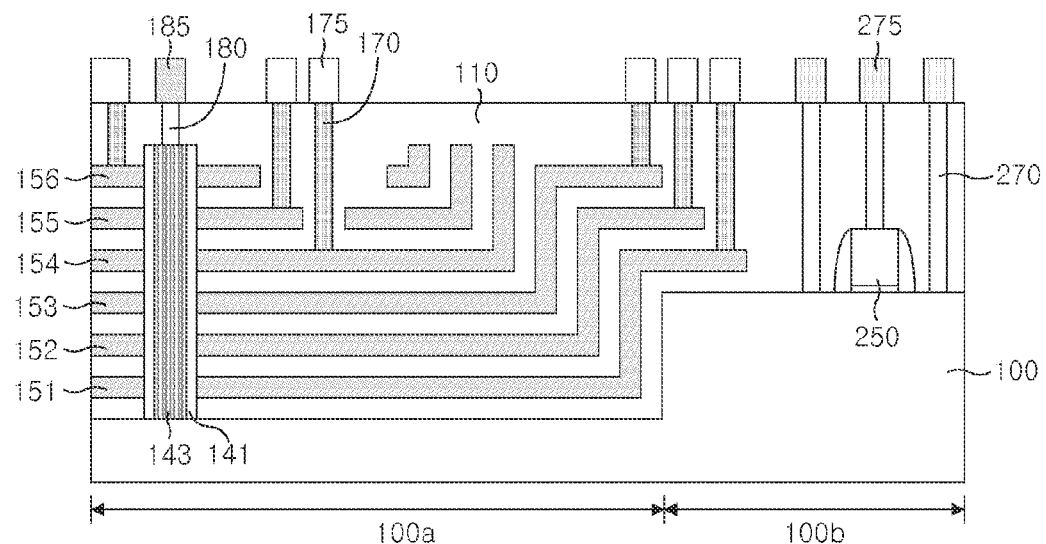
FIG. 12A is a sectional view illustrating a method of fabricating a semiconductor device according to other example embodiments of the inventive concepts.
Figure 12B:
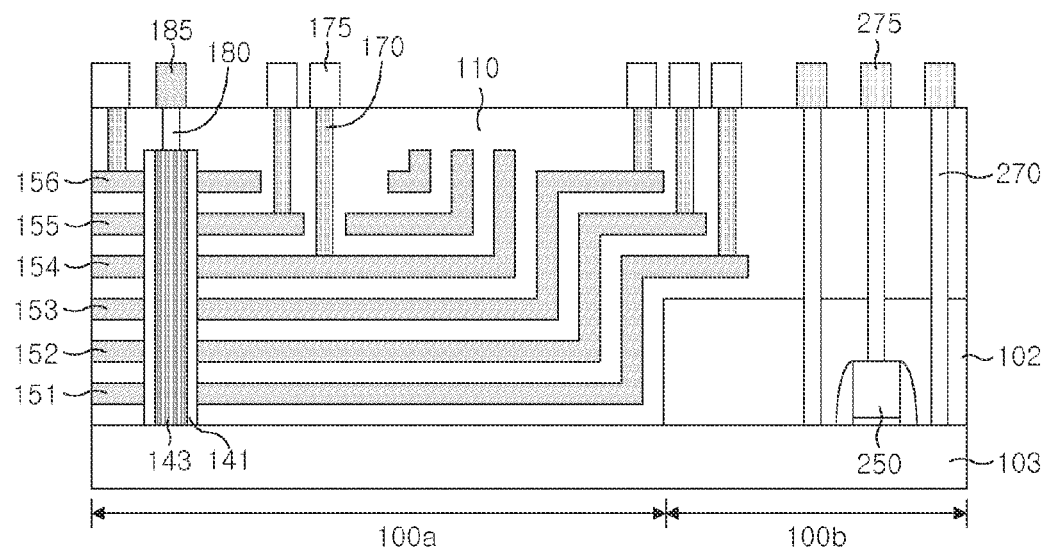
FIG. 12B is a sectional view illustrating a method of fabricating a semiconductor device according to still other example embodiments of the inventive concepts.

FIG. 12A is a sectional view illustrating a method of fabricating a semiconductor device according to another example embodiments of the inventive concepts, and FIG. 12B is a sectional view illustrating a method of fabricating a semiconductor device according to still other example embodiments of the inventive concepts.

Referring to FIG. 12A, a peripheral circuit 250 may be formed on the circumference region 100b of the substrate 100. Peripheral metal contact plugs 270 may be electrically connected to the peripheral circuit 250 and/or the substrate 100. In some embodiments, the peripheral metal contact plugs 270 may be simultaneously formed with the metal contact plugs 170. Peripheral metal interconnection lines 275 may be electrically connected to the peripheral metal contact plugs 270. In some embodiments, the peripheral metal interconnection lines 275 may be simultaneously formed with the metal interconnection lines 175.

Referring to FIG. 12B, a circumference portion 102 may be additionally formed on a flat semiconductor substrate 103. The circumference portion 102 may be formed by depositing and patterning an insulating layer (e.g., of SiOx, SiNx, or SiON) on the flat semiconductor substrate 103. In some embodiments, the peripheral circuit 250 may be formed in the circumference portion 102. All possible embodiments of the inventive concepts can be realized using the afore-described process of forming the peripheral circuit 250 and/or the circumference portion 102.

[Terracing Process: Modified Embodiments]

Figure 13A:
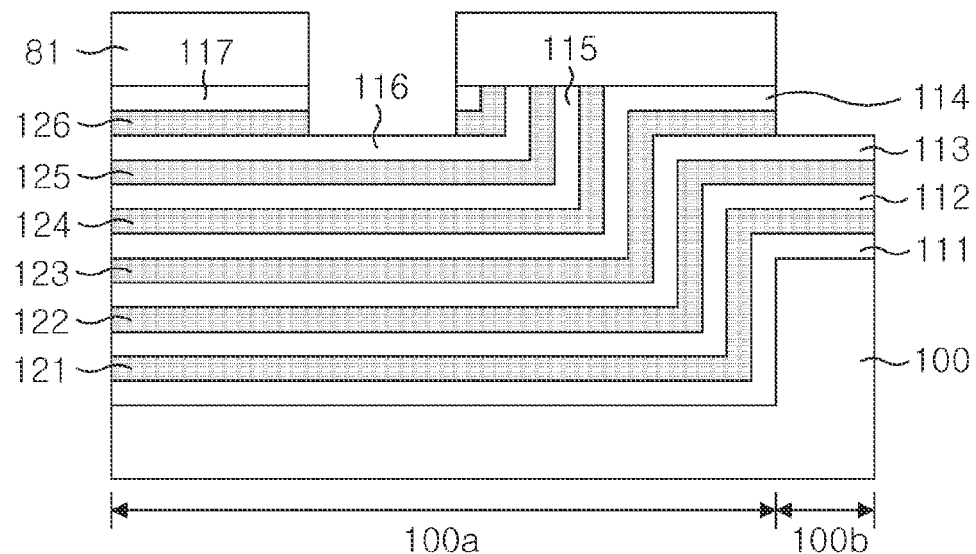
FIGS. 13A and 13B are sectional views illustrating a method of fabricating a semiconductor device according to even other example embodiments of the inventive concepts.
Figure 13B:
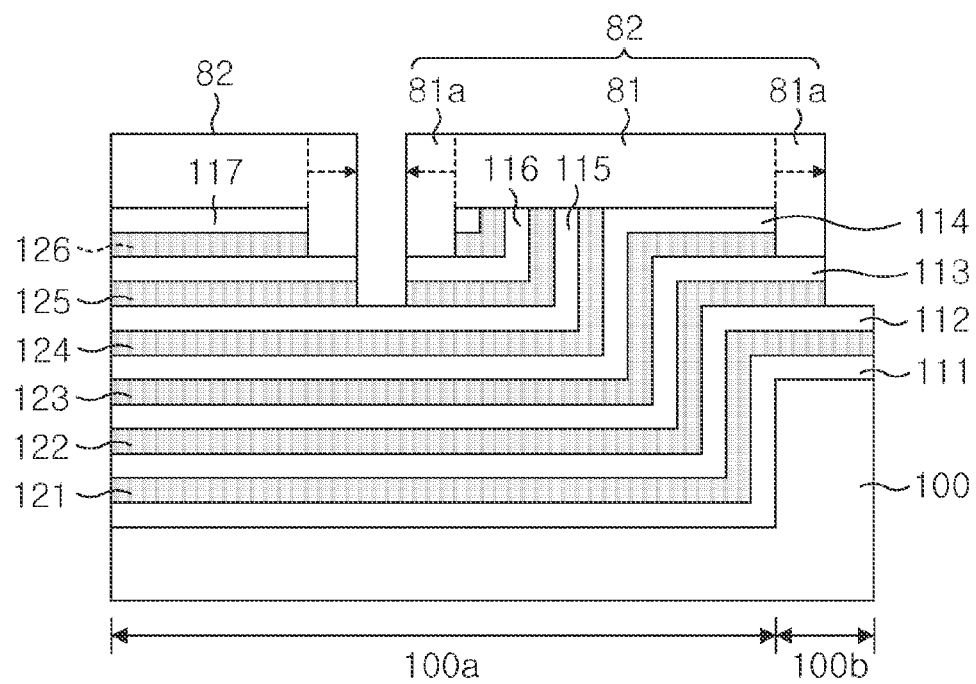

FIGS. 13A and 13B are sectional views illustrating a method of fabricating a semiconductor device according to even other example embodiments of the inventive concepts.

Referring to FIG. 13A, after processing shown in FIGS. 4A/4B an etching process using a first mask 81 may be performed to pattern the seventh insulating layer 117 and the sixth sacrificial layer 126 disposed on the recess region 100a and to pattern the fourth insulating layer 114 and the third sacrificial layer 123 disposed on the circumference region 100b.

Referring to FIG. 13B, an insulating layer may be deposited and anisotropically etched to form spacers 81a disposed on both sidewalls of the first mask 81. In some embodiments, the spacers 81a and the first mask 81 may constitute a second mask 82 enlarging the first mask 81. An etching process using the second mask 82 as an etch mask may be performed to pattern the sixth insulating layer 116 and the fifth sacrificial layer 125 disposed on the recess region 100a and to pattern the third insulating layer 113 and the second sacrificial layer 122 disposed on the circumference region 100b. That is, the terracing process according to the present embodiments may be performed using the enlarged mask (i.e., the second mask 82), and all possible embodiments of the inventive concepts can be realized using the afore-described terracing process. The method then continues with FIGS. 7A/7B after the masks are removed.

[Fabricating Method: Yet Other Example Embodiments]

FIGS. 14A through 19A and FIGS. 14B through 19B show a method of fabricating a semiconductor device according to yet other example embodiments of the inventive concepts.

FIGS. 14A through 19A are sectional views taken along xz-plane in FIG. 1A, and FIGS. 14B through 19B are sectional views taken along yz-plane in FIG. 1A.

Figure 14A:
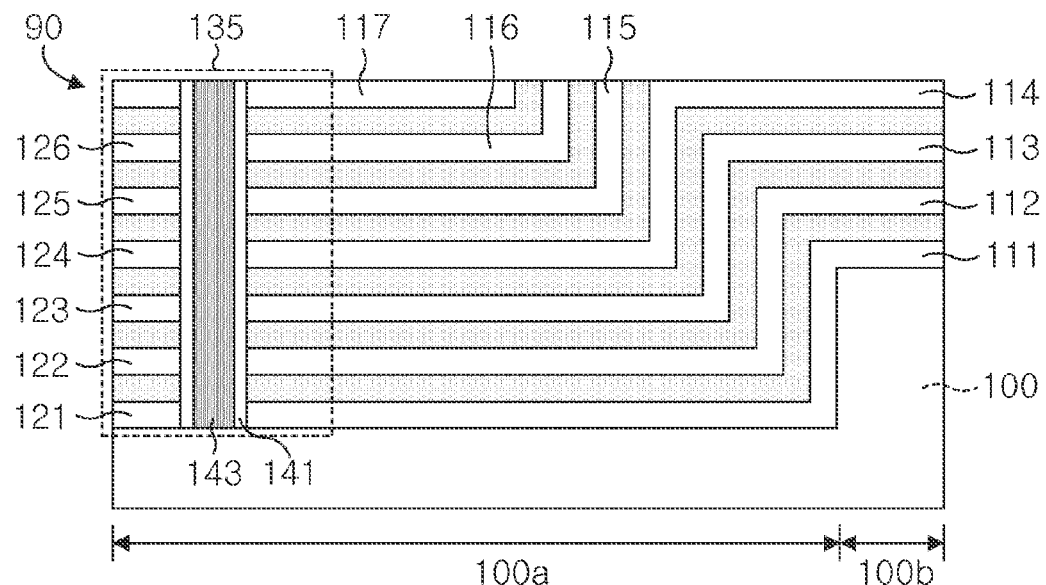
Figure 14B:
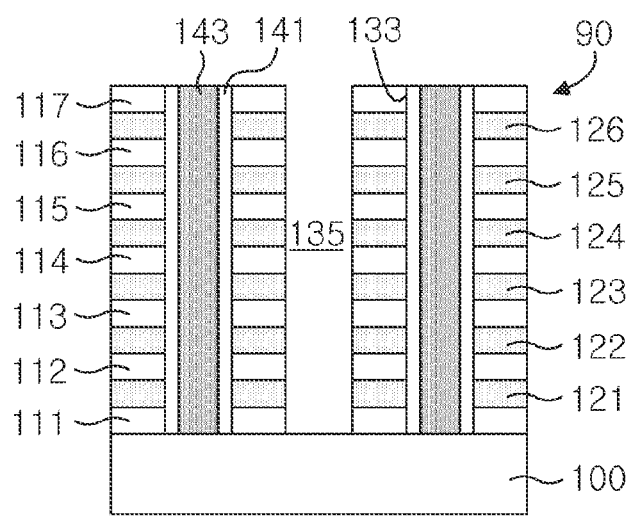

Referring to FIGS. 14A and 14B, first to seventh insulating layers 111-117 and first to sixth sacrificial layers 121-126 may be alternatingly and conformably formed on a terraced substrate 100 to form a stepwise mold stack 90. Thereafter, vertical channels 143 penetrating the mold stack 90 may be formed to be electrically connected to the substrate 100 and memory layers 141 surrounding the vertical channels 143 may be formed. Thereafter, word-line cut regions 135 may be formed between the vertical channels 143 to expose the substrate 100 or the first insulating layer 111.

Figure 15A:
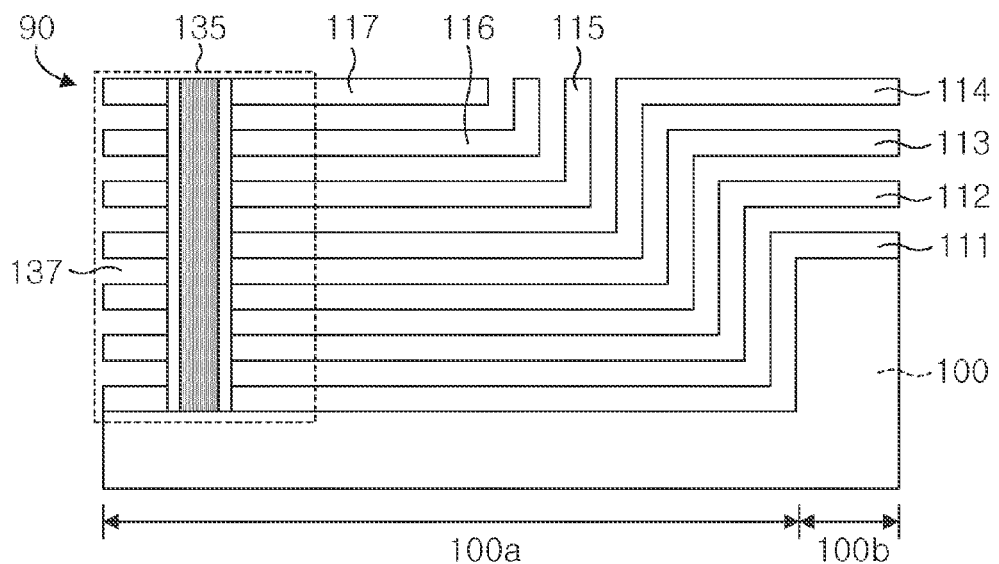
Figure 15B:
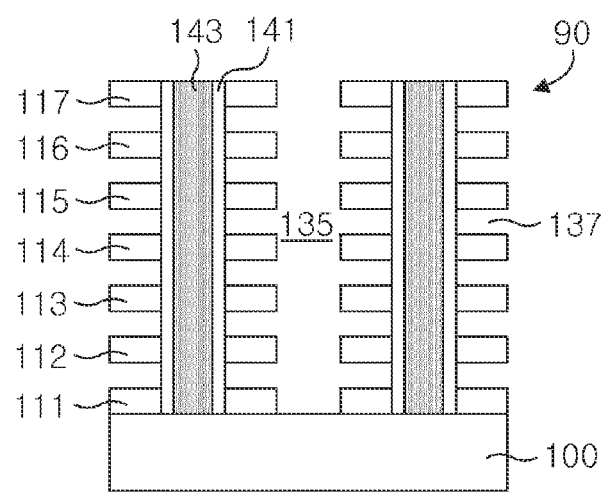

Referring to FIGS. 15A and 15B, first to sixth sacrificial layers 121-126 may be removed by supplying an etchant through the word-line cut region 135. As the result of the removal of the sacrificial layers 121-126, evacuated regions 137 may be formed between the insulating layers 111-117 to expose the memory layer 141.

Figure 16A:
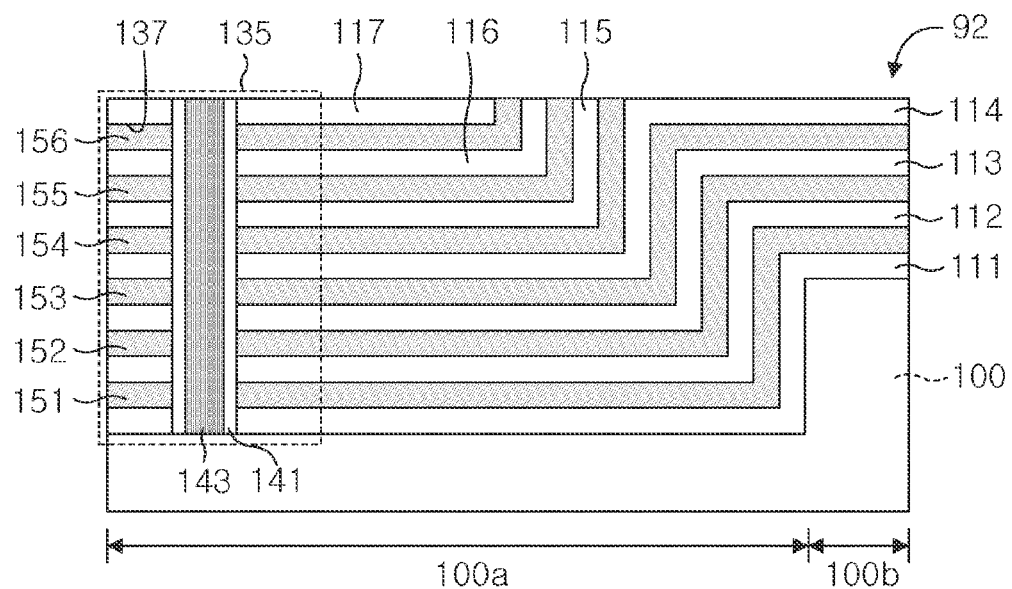
Figure 16B:
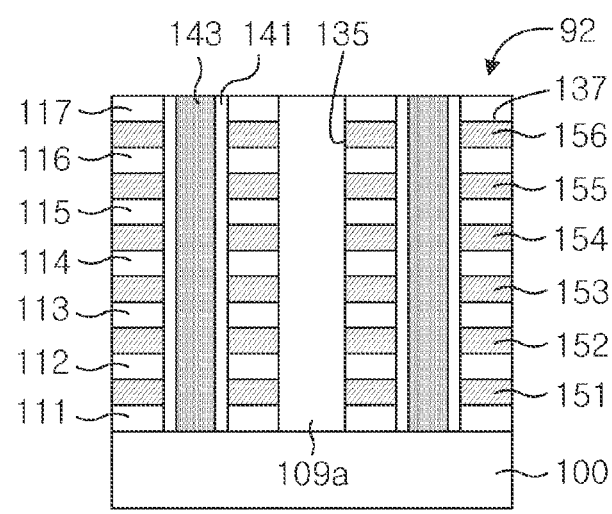

Referring to FIGS. 16A and 16B, a gate stack 92 including first to sixth the conductive layers 151-156 may be formed to fill the evacuated regions 137. The formation of the gate stack 92 may include depositing a conductive layer to fill the evacuated regions 137 and etching the conductive layer to re-open the word-line cut regions 135. As a result, the first to sixth the conductive layers 151-156 may be stacked on the terraced substrate 100 to have a stepwise portion. The word-line cut region 135 may be filled with a gap-fill insulating layer 109a.

Figure 17A:
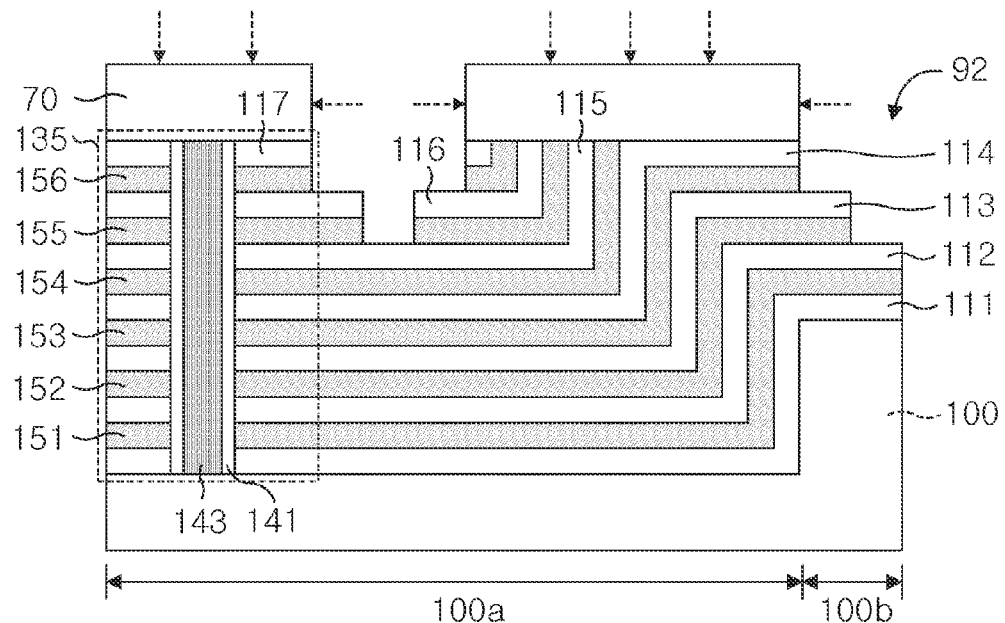
Figure 17B:
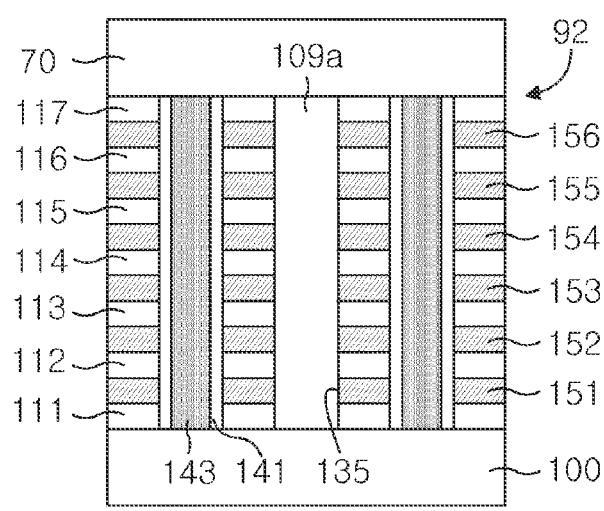

Referring to FIGS. 17A and 17B, the gate stack 92 may be patterned using a terracing process. In some embodiments, the terracing process may be performed in a manner of trimming a mask 70, and the gate stack 92 may be simultaneously patterned at both of the recess region 100a and the circumference region 100b during the terracing process. In other embodiments, the terracing process may be performed in a manner of enlarging a mask, as described with reference to FIGS. 13A and 13B. Each of the fifth and sixth conductive layers 155 and 156 may be horizontally separated into two portions by the terracing process, and one of the separated portions, adjacent to the vertical channel 143, may serve as a contact area. As the result of the formation of the word-line cut regions 135, the sixth conductive layer 156 may be separated into a plurality of lines. The fourth conductive layer 154 may include a portion that is not covered with the fifth conductive layer 155 and is newly exposed by the terracing process, and this portion may serve as a contact area.

Figure 18A:
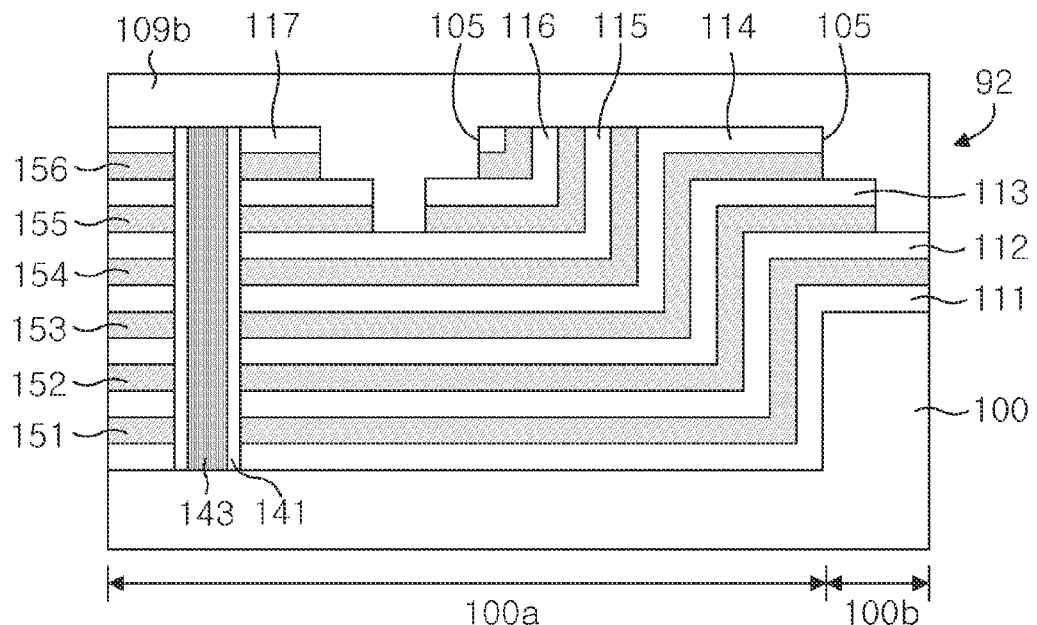
Figure 18B:
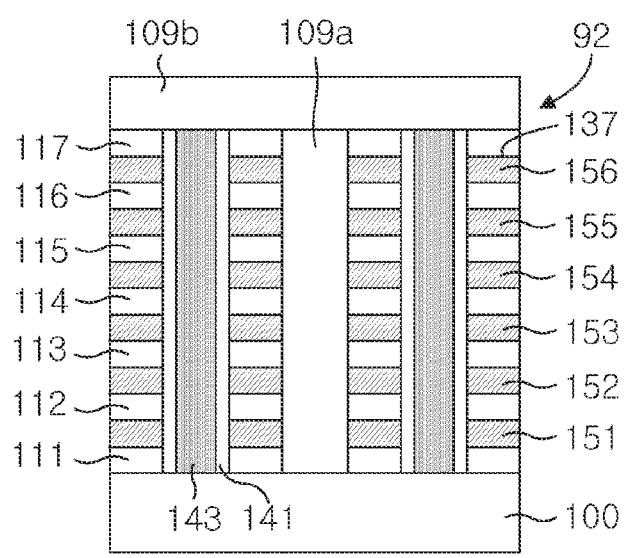

Referring to FIGS. 18A and 18B, the mask 70 may be removed and an interlayer dielectric 109b may be formed to cover the gate stack 92. The interlayer dielectric 109b may fill open regions 105 formed by the terracing process. Hereinafter, for concise description, a term 'insulating layer 110' will be used to commonly indicate the first to seventh insulating layer 111-117, the gap-fill insulating layer 109, and the interlayer dielectric 109b, as shown in FIG. 10A.

Figure 19A:
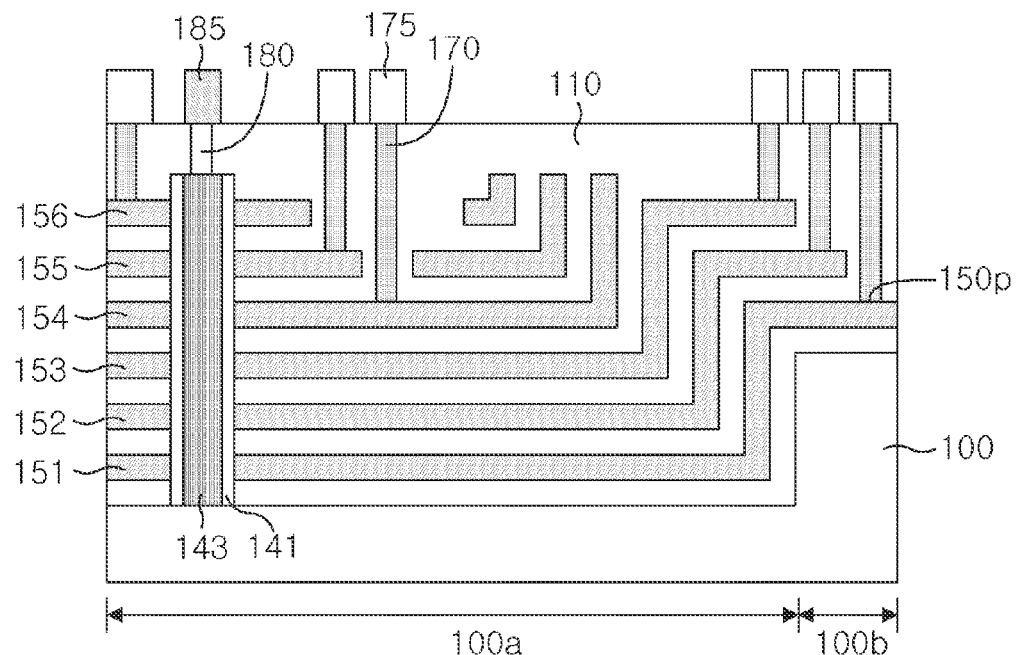
Figure 19B:
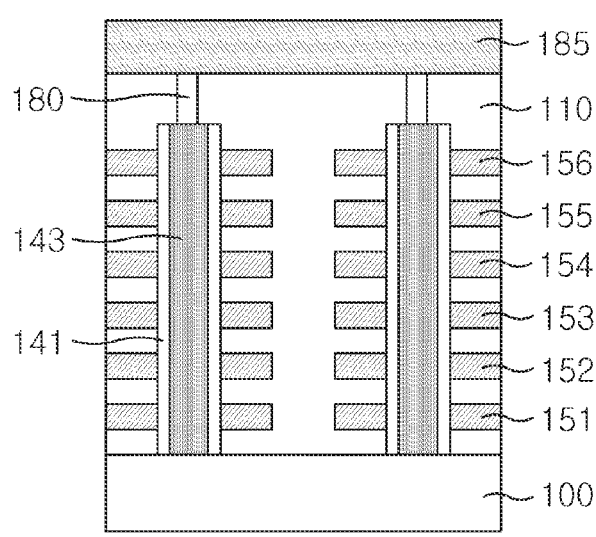

Referring to FIGS. 19A and 19B, metal contact plugs 170 may be formed through the insulating layer 110 and be connected to contact areas 150p of the conductive layers 151-156, respectively. In some embodiments, all of the metal contact plugs 170 connected to the contact areas 150p may be simultaneously formed using the same process. Furthermore, in some embodiments, bit line contact plugs 180 electrically connected to the vertical channel 143 may be formed during the formation of the metal contact plugs 170. Metal interconnection lines 175 may be formed on the insulating layer 110 and be connected to the metal contact plugs 170. Bit lines 185 may be formed on the insulating layer 110 and be connected to the bit line contact plugs 180. In some embodiments, the metal interconnection lines 175 and the bit lines 185 may be simultaneously formed using the same process.

[Fabricating Method: Further Example Embodiments]

FIGS. 20A through 25A and FIGS. 20B through 25B show a method of fabricating a semiconductor device according to further example embodiments of the inventive concepts. FIGS. 20A through 25A are sectional views taken along xz-plane in FIG. 1A, and FIGS. 20B through 25B are sectional views taken along yz-plane in FIG. 1A.

Figure 20A:
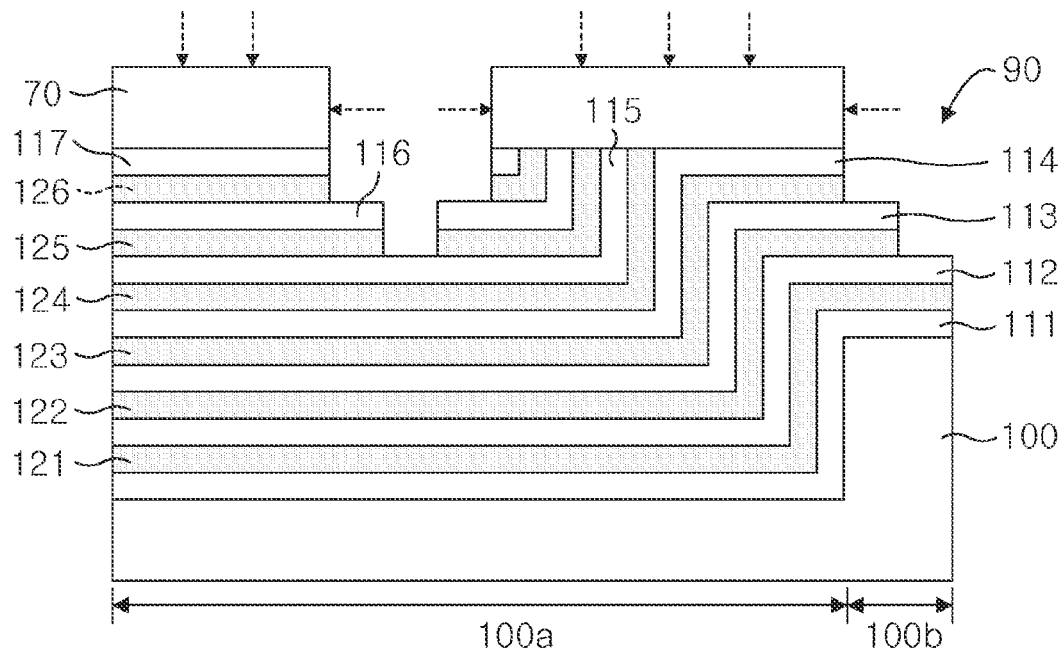
Figure 20B:
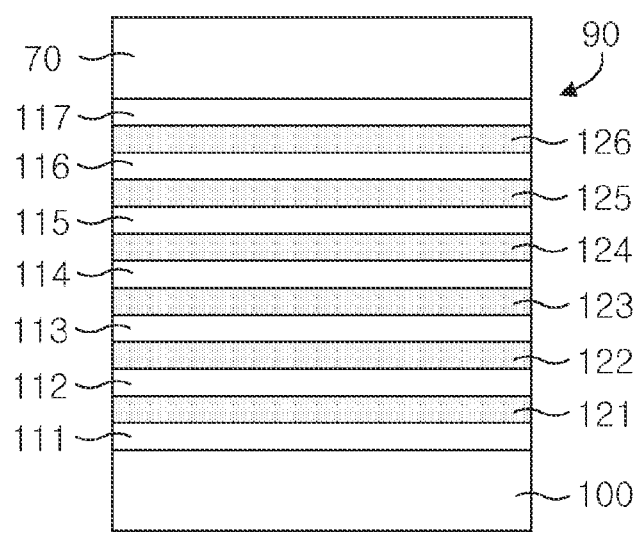

Referring to FIGS. 20A and 20B, first to seventh insulating layers 111-117 and first to sixth sacrificial layers 121-126 may be alternatingly and conformably formed on a terraced substrate 100 to form a stepwise mold stack 90. In some embodiments, the mold stack 90 may be patterned by a terracing process including steps of trimming a mask 70 and anisotropically etching the mold stack 90 using the mask 70 as an etch mask. As a result, the mold stack 90 may have a terraced structure at both of the recess region 100a and the circumference region 100b. During the terracing process, on the recess region 100a, the seventh insulating layer 117 and the sixth sacrificial layer 126 may be twice etched and the sixth insulating layer 116 and the fifth sacrificial layer 125 may be once etched. Due to the difference in the number of etching process, the mold stack 90 may have the terraced structure at the recess region 100a. At the same time, during the terracing process, on the circumference region 100b, the fourth insulating layer 114 and the third sacrificial layer 123 may be twice etched and the third insulating layer 113 and the second sacrificial layer 122 may be once etched. As a result, the mold stack 90 may have the terraced structure at the circumference region 100b.

Figure 21A:
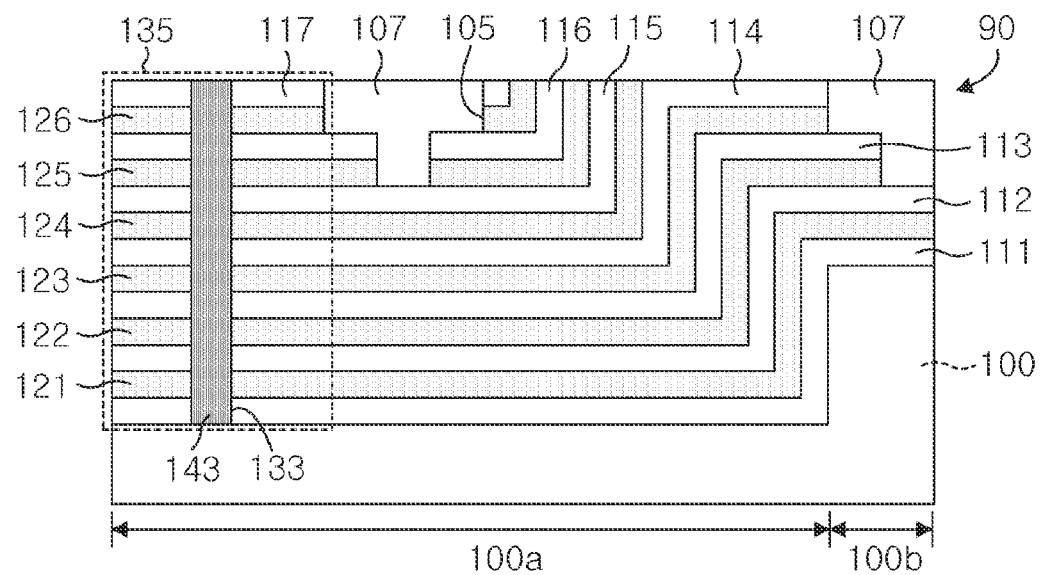
Figure 21B:
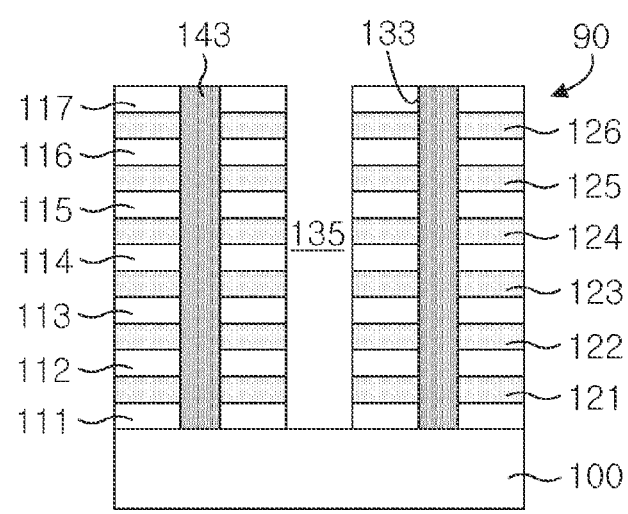

Referring to FIGS. 21A and 21B, the mask 70 may be removed and capping insulating layers 107 may be formed to fill open regions 105 formed by the terracing process. Thereafter, vertical holes 133 may be formed through the mold stack 90 to expose the substrate 100, and vertical channels 143 may be formed to fill the vertical holes 133. As a result, the vertical channels 143 may be coupled to the substrate 100. In some embodiments, the formation of the vertical channels 143 may be performed after or before the terracing process. The mold stack 90 may be patterned to form word-line cut regions 135 exposing the substrate 100 or the first insulating layer 111 through the mold stack 90. As the result of the formation of the word-line cut regions 135, the seventh insulating layer 117 and the sixth sacrificial layer 126 may be separated into a plurality of lines.

Figure 22A:
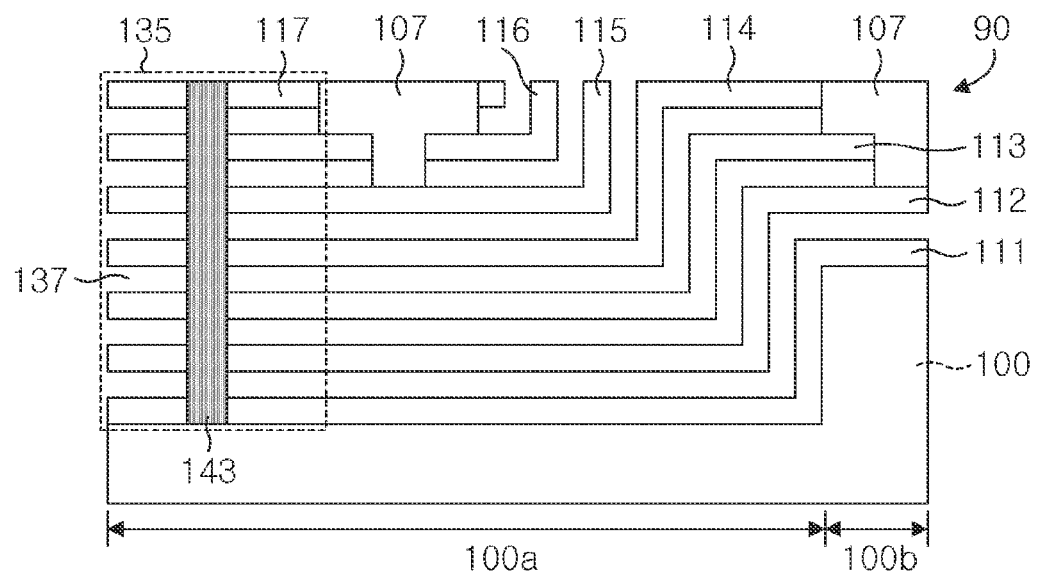
Figure 22B:
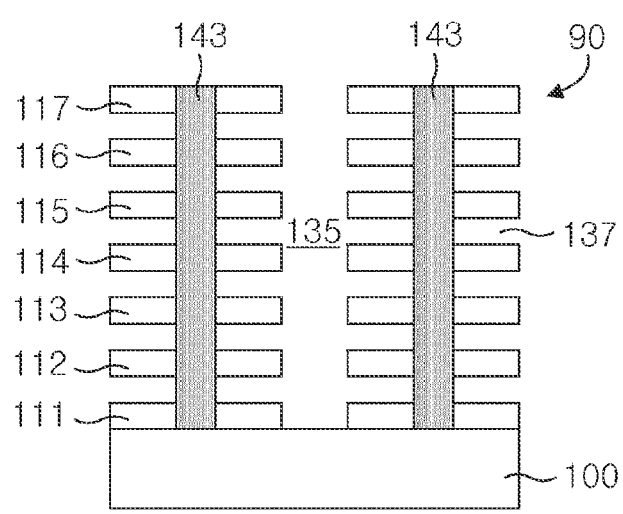

Referring to FIGS. 22A and 22B, the sacrificial layers 121-126 may be removed by supplying an etchant through the word-line cut region 135. As the result of the removal of the sacrificial layers 121-126, evacuated regions 137 may be formed between the insulating layers 111-117 to expose sidewalls of the vertical channels 143.

Figure 23A:
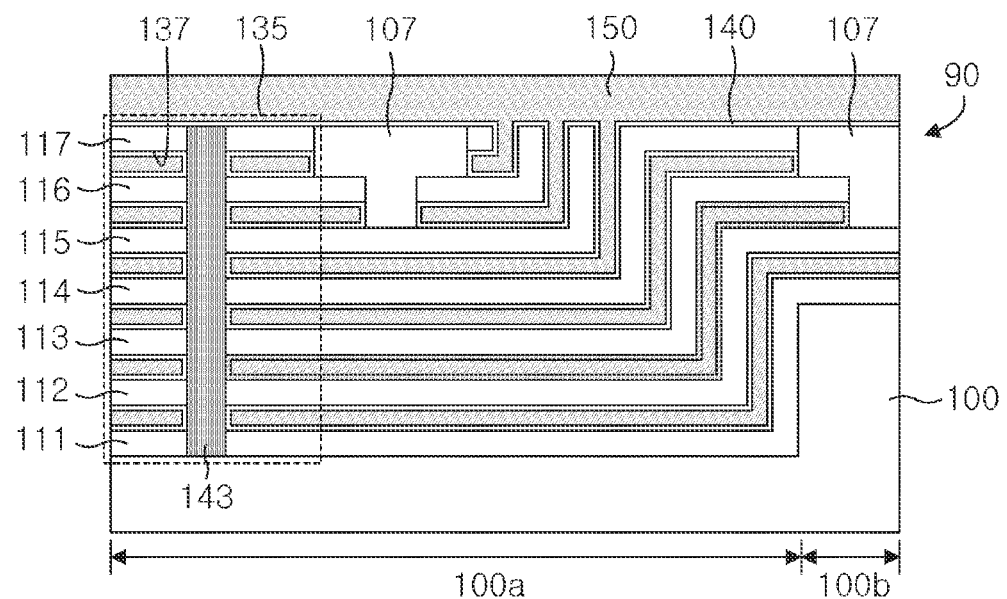
Figure 23B:
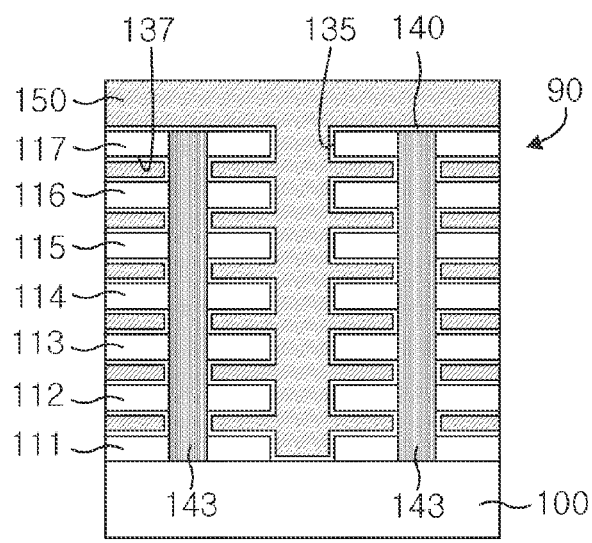

Referring to FIGS. 23A and 23B, a multi-layered insulating layer 140 may be formed to cover outer surfaces of the insulating layers 111-117 and the sidewalls of the vertical channels 143 exposed by the evacuated regions 137. In some embodiments, the multi-layered insulating layer 140 may be formed by, for instance, sequentially depositing a tunnel layer, a trap insulating layer, and a blocking layer. The multi-layered insulating layer 140 may be formed to have a thickness not to fully fill the evacuated regions 137. Thereafter, a conductive layer 150 may be formed on the mold stack 90 to fill the evacuated regions 137 and the word-line cut region 135 provided with the multi-layered insulating layer 140. The conductive layer 150 may be formed by depositing a polysilicon or metal layer.

Figure 24A:
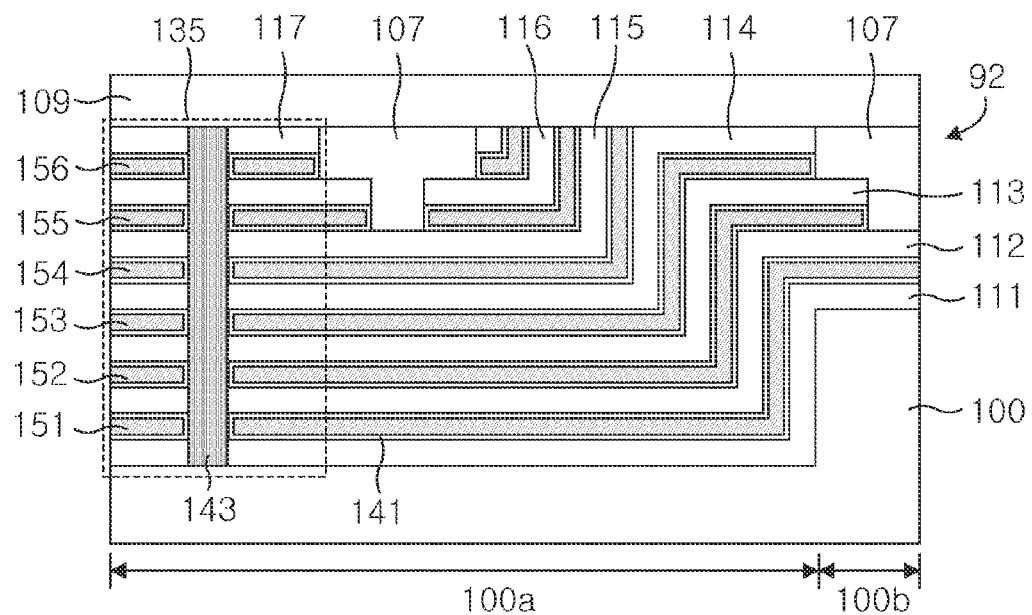
Figure 24B:
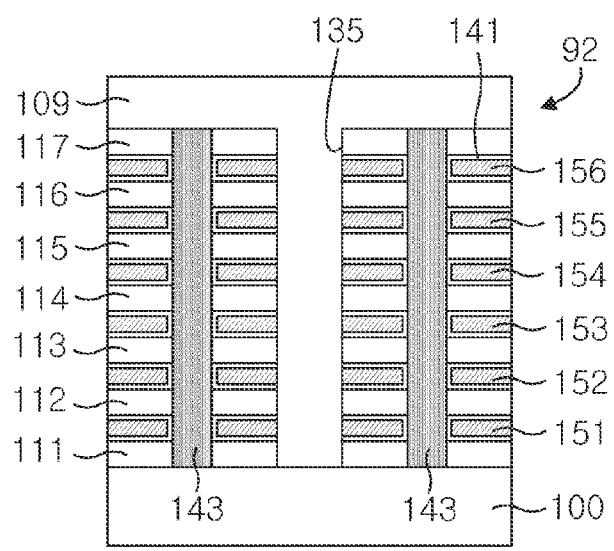

Referring to FIGS. 24A and 24B, the conductive layer 150 and the multi-layered insulating layer 140 may be partially removed to form a gate stack 92. The gate stack 92 may include first to sixth conductive layers 151-156 having stepwise portions and forming a terraced structure. The multi-layered insulating layer 140, which is partially removed, may form a memory layer 141 interposed between the vertical channel 143 and the first to sixth conductive layers 151-156 and between the insulating layers 111-117 and the first to sixth conductive layers 151-156. A gap-fill insulating layer 109 may be formed to fill the word-line cut region 135 and cover the gate stack 92. In modified embodiments, as shown in FIG. 1D, the memory layer 141 may include a first memory layer covering outer surfaces of the first to sixth the conductive layers 151-156 and a second memory layer surrounding the vertical channel 143. Here, the first memory layer may be formed using a different process from the second memory layer. The first memory layer may include a blocking insulating layer, the second memory layer may include a tunnel layer, and the trap insulating layer may be incorporated in the first memory layer or the second memory layer.

Figure 25A:
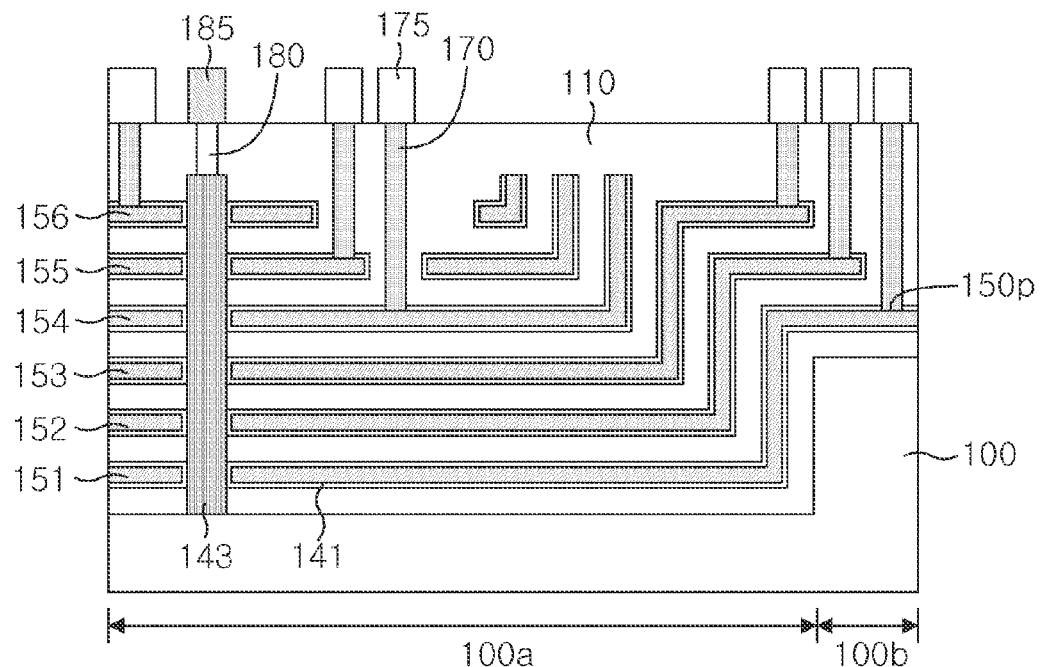
Figure 25B:
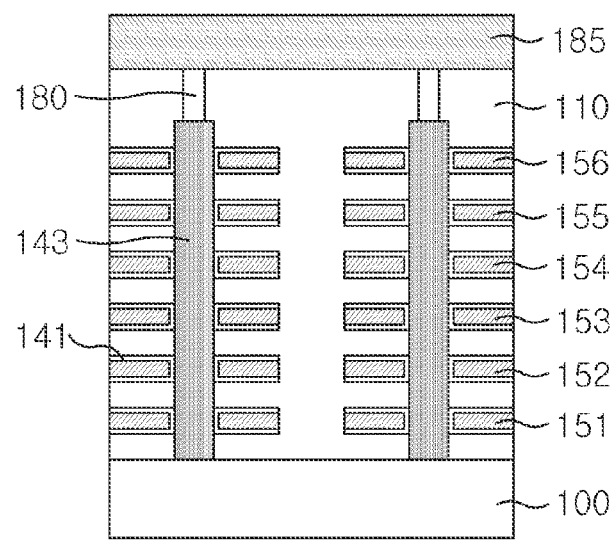

Referring to FIGS. 25A and 25B, metal contact plugs 170 may be formed through the insulating layer 110 and the memory layer 141 and be connected to the contact areas 150p of the first to sixth the conductive layers 151-156. In some embodiments, all of the metal contact plugs 170 connected to the contact areas 150p may be simultaneously formed using the same process. Furthermore, in some embodiments, bit line contact plugs 180 electrically connected to the vertical channel 143 may be formed during the formation of the metal contact plugs 170. Metal interconnection lines 175 may be formed on the insulating layer 110 and be connected to the metal contact plugs 170, and bit lines 185 may be formed on the insulating layer 110 and be connected to the bit line contact plugs 180. In some embodiments, the metal interconnection lines 175 and the bit lines 185 may be simultaneously formed using the same process.

[Fabricating Method: Still Further Example Embodiments]

FIGS. 26A through 29A and FIGS. 26B through 29B show a method of fabricating a semiconductor device according to still further example embodiments of the inventive concepts. FIGS. 26A through 29A are sectional views taken along xz-plane in FIG. 1A, and FIGS. 26B through 29B are sectional views taken along yz-plane in FIG. 1A.

Figure 26A:
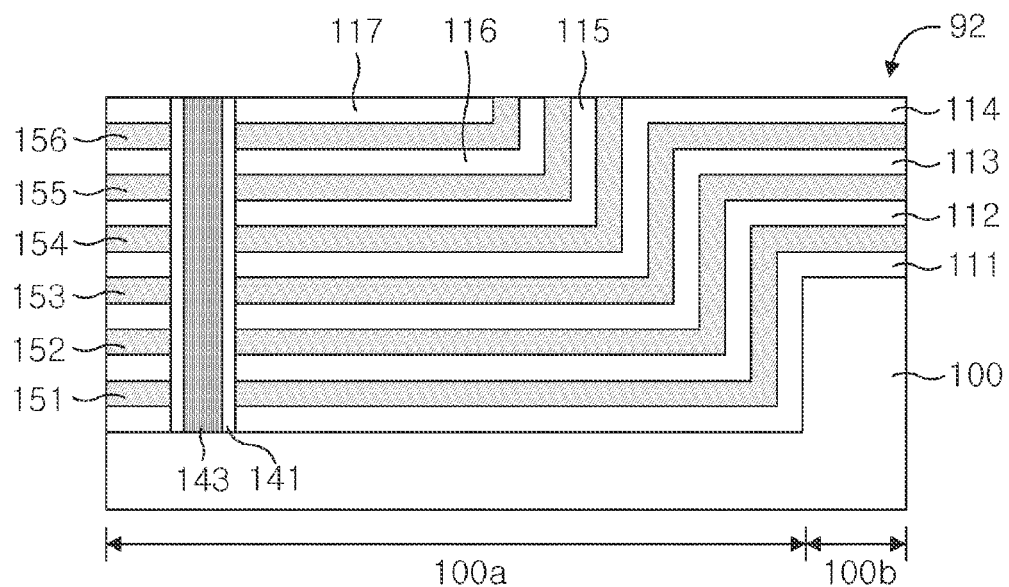
Figure 26B:
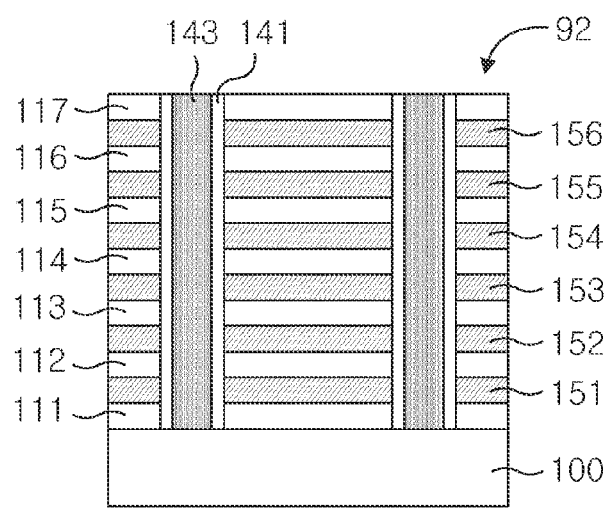

Referring to FIGS. 26A and 26B, insulating layers 111-117 and conductive layers 151-156 may be alternatingly and conformably formed on a terraced substrate 100 to form a gate stack 92 as described according to one of the previous embodiments. The insulating layers 111-117 may include at least one of a silicon oxide (SiOx) layer and a silicon nitride (SiNx) layer, and the conductive layers 151-156 may include at least one of a silicon layer and a metal layer. As shown in FIG. 1B, vertical channels 143 may be formed through the gate stack 92 and be coupled to the substrate 100, and memory layers 141 may be formed to surround the vertical channels 143. However, it will be understood that other embodiments such as FIG. 1C may be implemented.

Figure 27A:
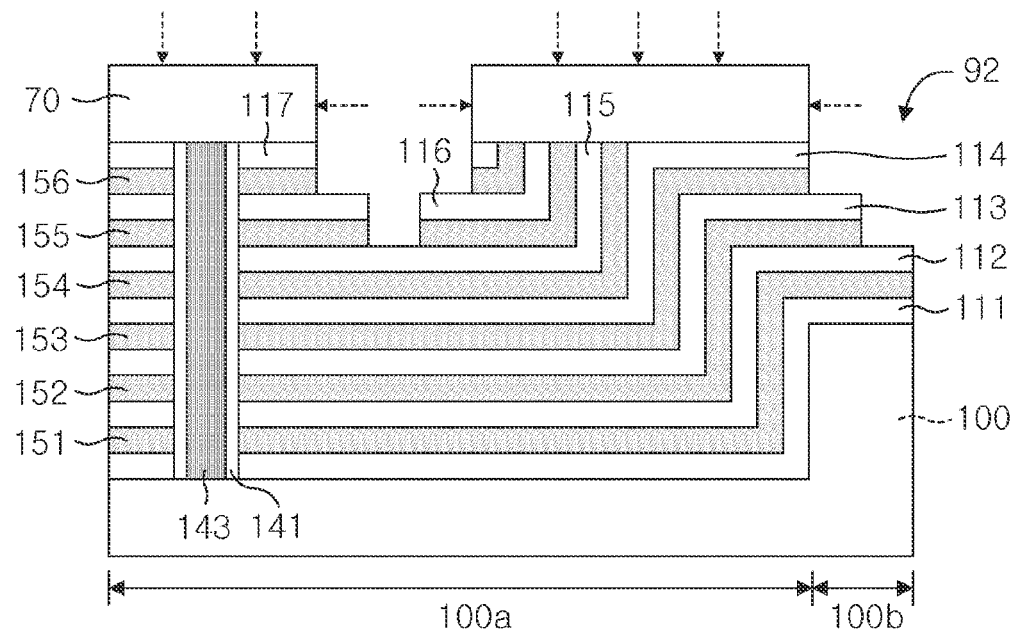
Figure 27B:
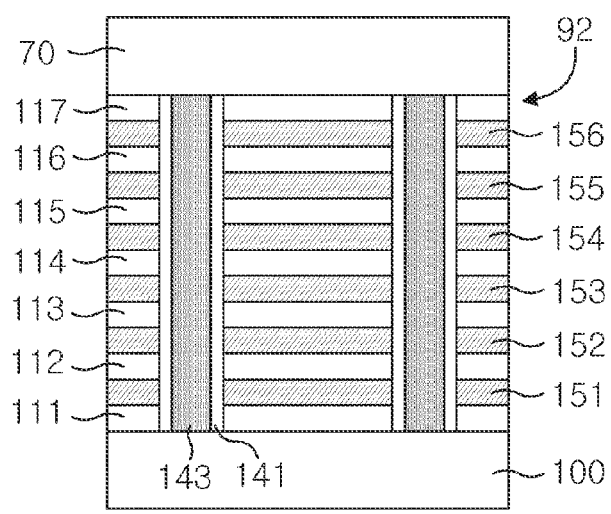

Referring to FIGS. 27A and 27B, the gate stack 92 may be patterned using a terracing process performed in a manner of trimming a mask 70 to have a terraced structure. During the terracing process, on the recess region 100a, the seventh insulating layer 117 and the sixth conductive layer 156 may be twice etched and the sixth insulating layer 116 and the fifth conductive layer 155 may be once etched. Due to the difference in the number of etching process, the mold stack 90 may have the terraced structure at the recess region 100a. At the same time, during the terracing process, on the circumference region 100b, the fourth insulating layer 114 and the third conductive layer 153 may be twice etched and the third insulating layer 113 and the second conductive layer 152 may be once etched. As a result, the mold stack 90 may have the terraced structure at the circumference region 100b. In other embodiments, the vertical channels 143 and the memory layers 141 may be formed after performing the terracing process.

Figure 28A:
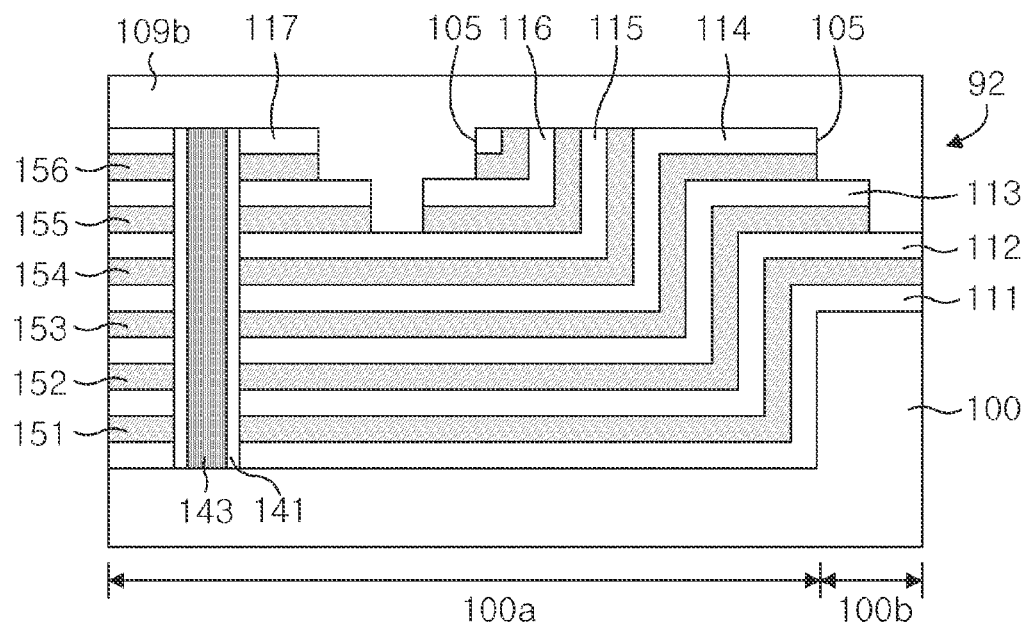
Figure 28B:
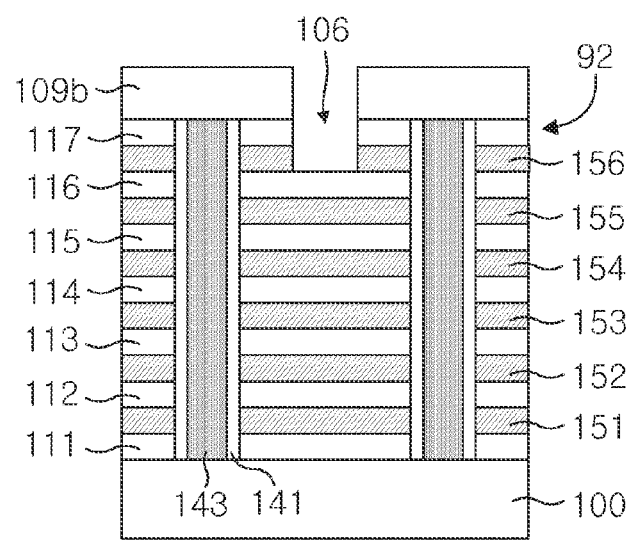

Referring to FIGS. 28A and 28B, the mask 70 may be removed and an interlayer dielectric 109b may be formed to cover the gate stack 92. The interlayer dielectric 109b may fill open regions 105 formed by the terracing process. In some embodiments, the seventh insulating layer 117 and the sixth conductive layer 156 may be patterned to form a separating region 106, before or after the formation of the interlayer dielectric 109b. Due to the presence of the separating region 106, the sixth conductive layer 156 may be separated into a plurality of lines. The separating region 106 may be filled with an insulating material.

Figure 29A:
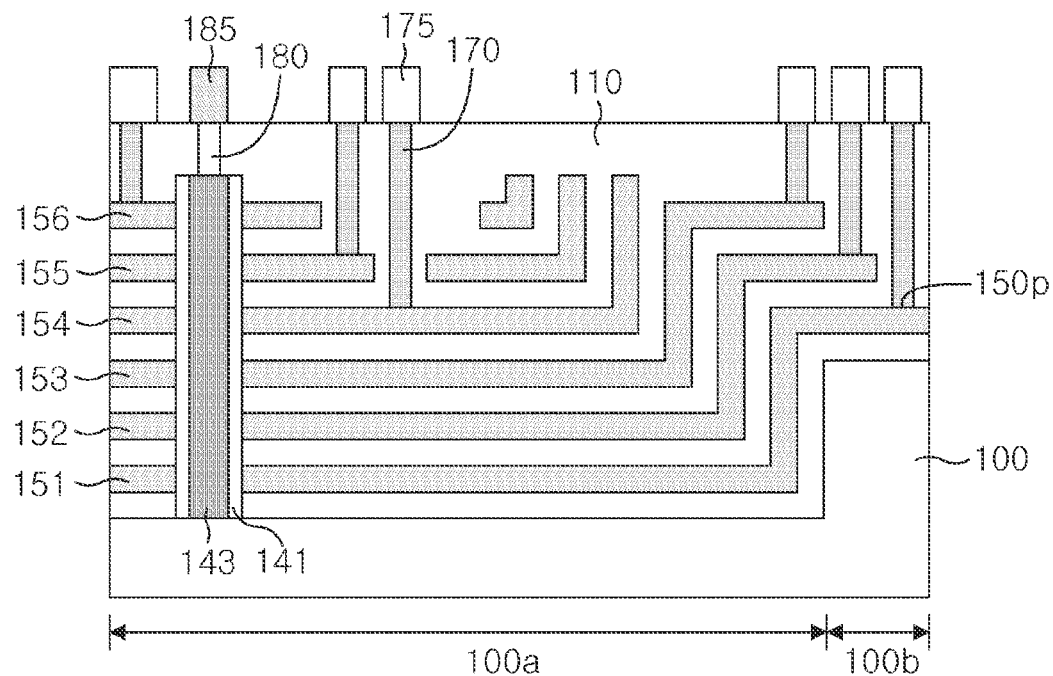
Figure 29B:
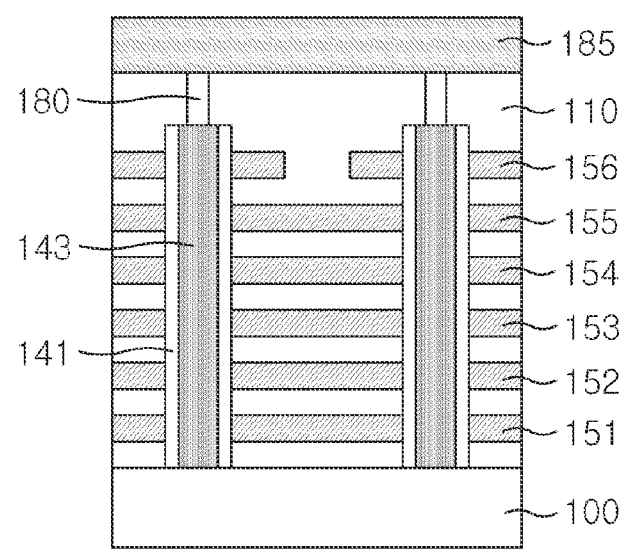

Referring to FIGS. 29A and 29B, metal contact plugs 170 may be formed through the insulating layer 110 and be connected to contact areas 150p of the conductive layers 151-156, respectively. In some embodiments, all of the metal contact plugs 170 connected to the contact areas 150p may be simultaneously formed using the same process. Furthermore, in some embodiments, bit line contact plugs 180 electrically connected to the vertical channel 143 may be formed during the formation of the metal contact plugs 170. Metal interconnection lines 175 may be formed on the insulating layer 110 and be connected to the metal contact plugs 170, and bit lines 185 may be formed on the insulating layer 110 and be connected to the bit line contact plugs 180. In some embodiments, the metal interconnection lines 175 and the bit lines 185 may be simultaneously formed using the same process.

[Terracing Process for Triple-stepwise Substrate]

Figure 30A:
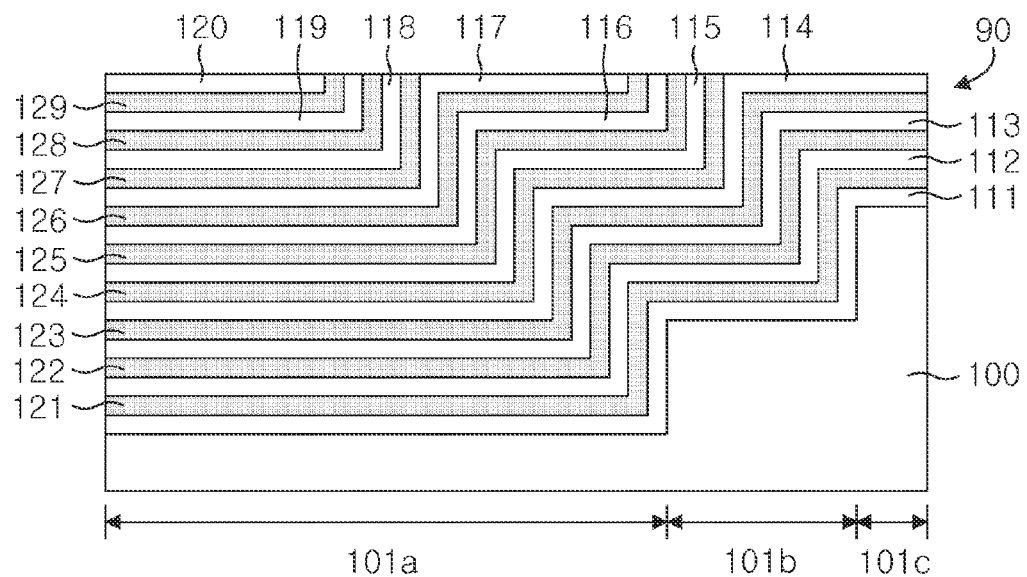
FIGS. 30A through 30C are sectional views illustrating a method of fabricating a semiconductor device according to even further example embodiments of the inventive concepts.
Figure 30B:
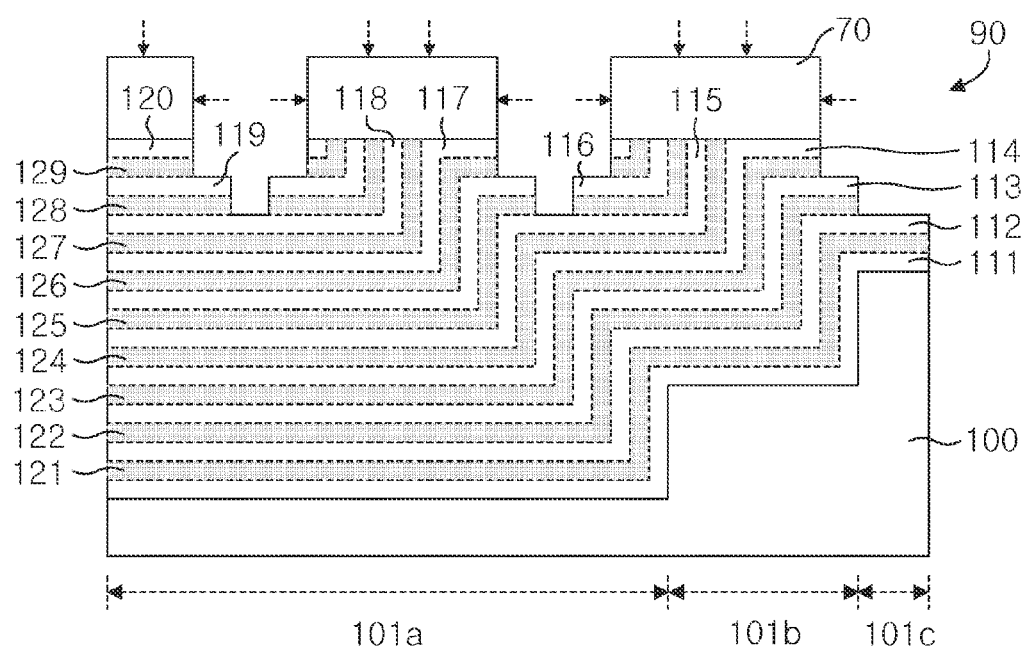
Figure 30C:
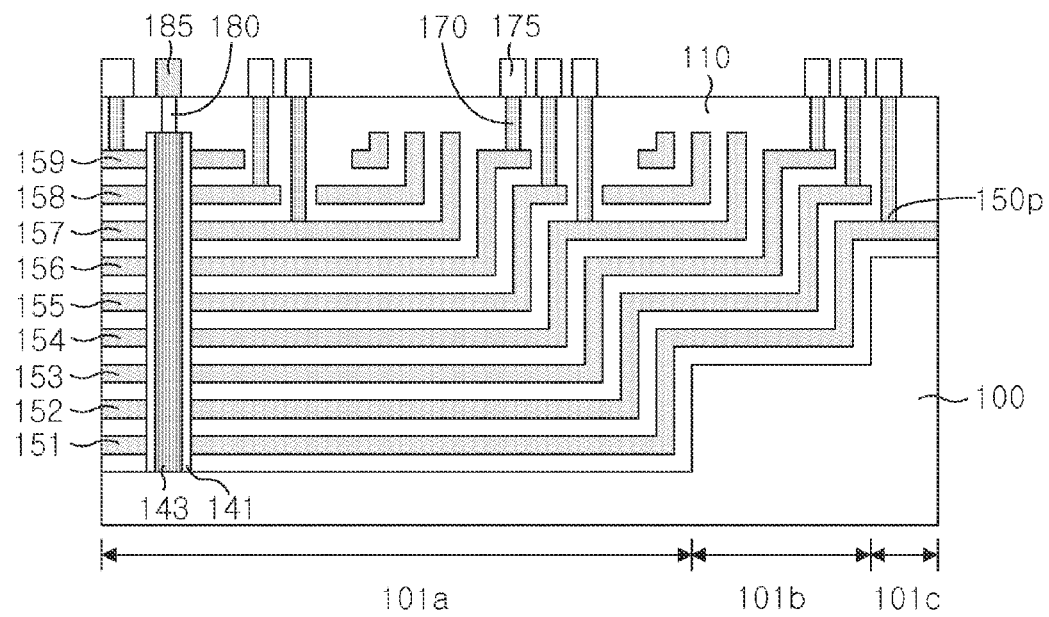

FIGS. 30A through 30C are sectional views illustrating a method of fabricating a semiconductor device according to even further example embodiments of the inventive concepts. Embodiments to be described below can be applied to the case of stacking the conductive layers, instead of the sacrificial layers 121-129, on the triple-stepwise substrate, in the same or similar manner.

Referring to FIG. 30A, a mold stack 90 may be formed on a substrate 100 having a triple-stepwise structure. For instance, a process of partially recessing a flat substrate may be performed two or more times to form a first region 101a at a lowermost level, a third region 101c at an uppermost level, and a second region 101b at an intermediate level (i.e., between the first and third regions 101a and 101c). The mold stack 90 may include insulating layers 111-120 and sacrificial layers 121-129, which may be alternatingly and conformably stacked on the triple-stepwise substrate 100. Some layers of the mold stack 90 (e.g., first to third sacrificial layers 121-123) may be formed to have three stepwise portions, others (e.g., fourth to sixth sacrificial layers 124-126) may be formed to have two stepwise portions, and the other (e.g., seventh to ninth sacrificial layers 127-129) may be formed to have a 'L'-shape.

Referring to FIG. 30B, the mold stack 90 may be patterned by a terracing process including steps of trimming a mask 70 and anisotropically etching the mold stack 90 using the mask 70 as an etch mask. As a result, the mold stack 90 may have a terraced structure. For instance, during the terracing process, an etching process may be twice performed on the tenth, seventh, and fourth insulating layers 120, 117 and 114 and the ninth, sixth, and third sacrificial layers 129, 126 and 123 and be once performed on the ninth, eighth, and sixth insulating layers 119, 128 and 116 and the fifth, third, and second sacrificial layers 125, 113 and 122. That is, ones of the insulating layers 111-120 and the sacrificial layers 121-129, whose top surfaces are positioned at the same or similar level, may be simultaneously etched, and this enable to simplify the process of forming the terraced structure of the mold stack 90. This example embodiment shows that the terracing process can be simplified by increasing the number of stepwise portions of an underlying structure disposed under the mold stack, even in the case that the number of layers included in the mold stack increases.

Referring to FIG. 30C, the sacrificial layers 121-129 may be replaced by conductive layers 151-159, and metal contact plugs 170 may be formed to be connected to contact areas 150p of the conductive layers 151-159. The replacement may be performed using the process described with reference to FIGS. 8A and 9A. Similar to the simplification of the terracing process, the formation of the metal contact plugs 170 can be simplified by increasing the number of stepwise portions of the underlying structure, even in the case that the number of the conductive layers increases.

[Terracing Process for the Case of Including Layers of Several Thicknesses]

FIGS. 31A through 31D are sectional views illustrating a method of fabricating a semiconductor device according to yet further example embodiments of the inventive concepts.

Figure 31A:
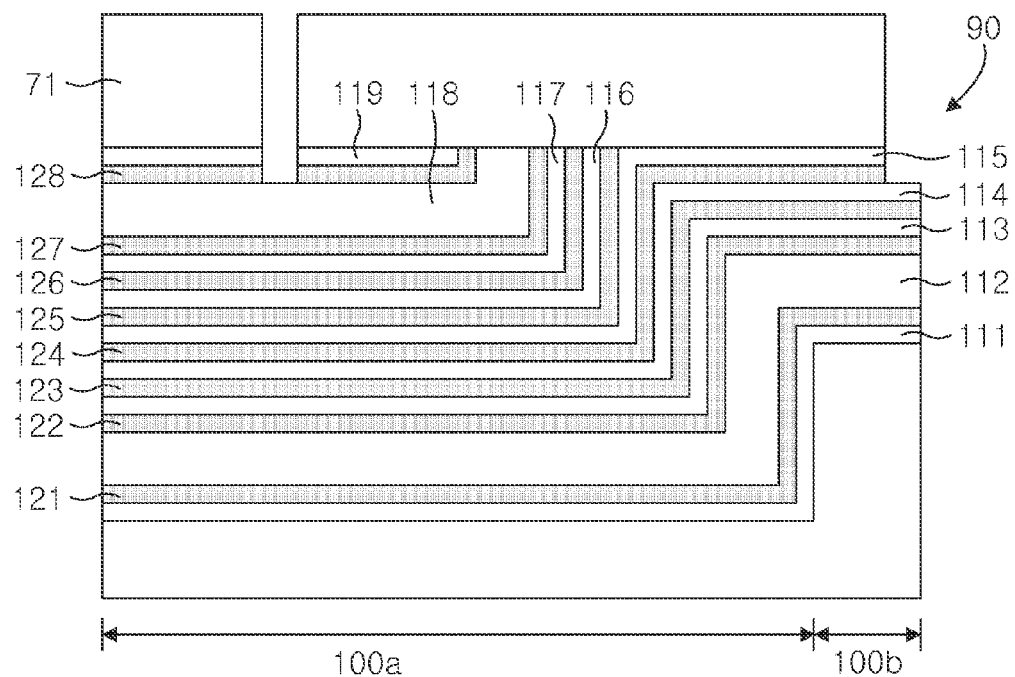
FIGS. 31A through 31D are sectional views illustrating a method of fabricating a semiconductor device according to yet further example embodiments of the inventive concepts.

Referring to FIG. 31A, a mold stack 90 may be formed on a terraced substrate 100 including a recess region 100a and a circumference region 100b. The mold stack 90 may include a plurality of insulating layers 111-119 and a plurality of sacrificial layers 121-128 that are alternatingly and conformably on the terraced substrate 100. In some embodiments, at least one of layers in the mold stack 90 may have a different thickness from the others. For instance, the second and eighth insulating layers 112 and 118 may be formed to have a greater thickness than the others of the insulating layers. The mold stack 90 may be firstly patterned using a first mask 71 thereon as an etch mask. The first patterning of the mold stack 90 may be performed to anisotropically etch the ninth insulating layer 119 and the eighth sacrificial layer 128 on the recess region 100a and the fifth insulating layer 115 and the fourth sacrificial layer 124 on the circumference region 100b.

Figure 31B:
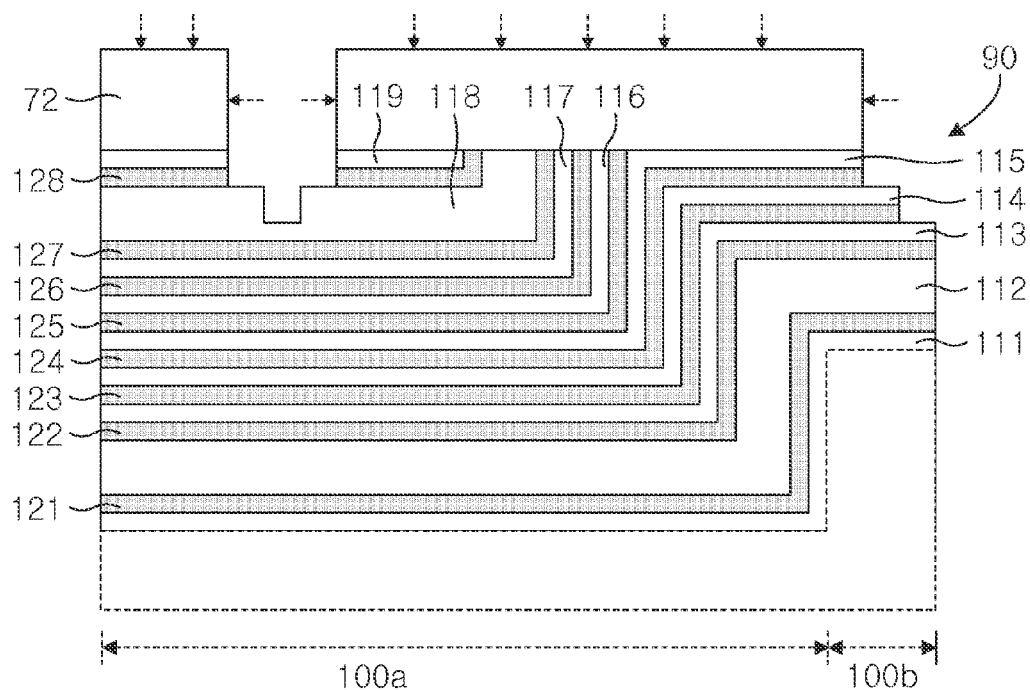

Referring to FIG. 31B, the mold stack 90 may be secondly patterned using a second mask 72 as an etch mask. The second mask 72 may be formed by a trimming process shrinking the first mask 71. The second patterning of the mold stack 90 may be performed to anisotropically etch portions of the ninth, fifth and fourth insulating layers 119, 115 and 114 and the eighth, fourth, third sacrificial layers 128, 124 and 123, which are newly exposed by the trimming process. As the result of the first and second patterning processes, the ninth and fifth insulating layers 119 and 115 and the eighth and fourth sacrificial layers 128 and 124 may be twice patterned, and the fourth insulating layer 114 and the third sacrificial layer 123 may be once patterned. Furthermore, a portion of the eighth insulating layer 118 on the recess region 100a may be recessed during the second patterning of the mold stack 90, because it is located at the same or similar level as the fourth insulating layer 114 and the third sacrificial layer 123 positioned on the circumference region 100b. In some embodiments, the second patterning of the mold stack 90 may be performed not to expose or etch the seventh sacrificial layer 127. This can be achieved by using the fact that the eighth insulating layer 118 is thicker than the fourth insulating layer 114 and the third sacrificial layer 123, and this enables to prevent the fourth insulating layer 114 and the third sacrificial layer 123 from being over-etched on the circumference region 100b.

Figure 31C:
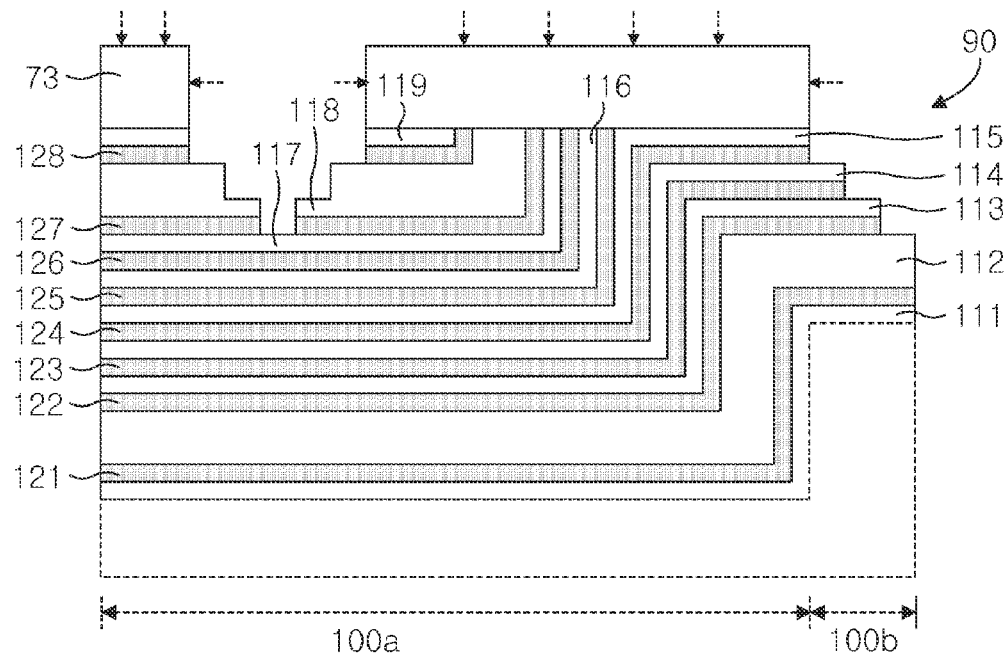

Referring to FIG. 31C, the mold stack 90 may be thirdly patterned using a third mask 73 as an etch mask. The third mask 73 may be formed by a trimming process shrinking the second mask 72. The third patterning of the mold stack 90 may be performed to etch portions of the ninth, fifth, fourth, and third insulating layers 119, 115, 114 and 113 and portions of the eighth, fourth, third, and second sacrificial layers 128, 124, 123 and 122, which are newly exposed by the trimming process. As the result of the first to third patterning processes, the ninth and fifth insulating layers 119 and 115 and the eighth and fourth sacrificial layers 128 and 124 may be thrice patterned, the fourth insulating layer 114 and the third sacrificial layer 123 may be twice patterned, and the third insulating layer 113 and the second sacrificial layer 122 may be once patterned. Furthermore, on the recess region 100a, the eighth insulating layer 118 may be twice patterned, and the seventh sacrificial layer 127 may be once patterned. Since the eighth insulating layer 118 may be twice patterned, the eighth insulating layer 118 may have a stepwise portion, as shown in FIG. 31C.

Figure 31D:
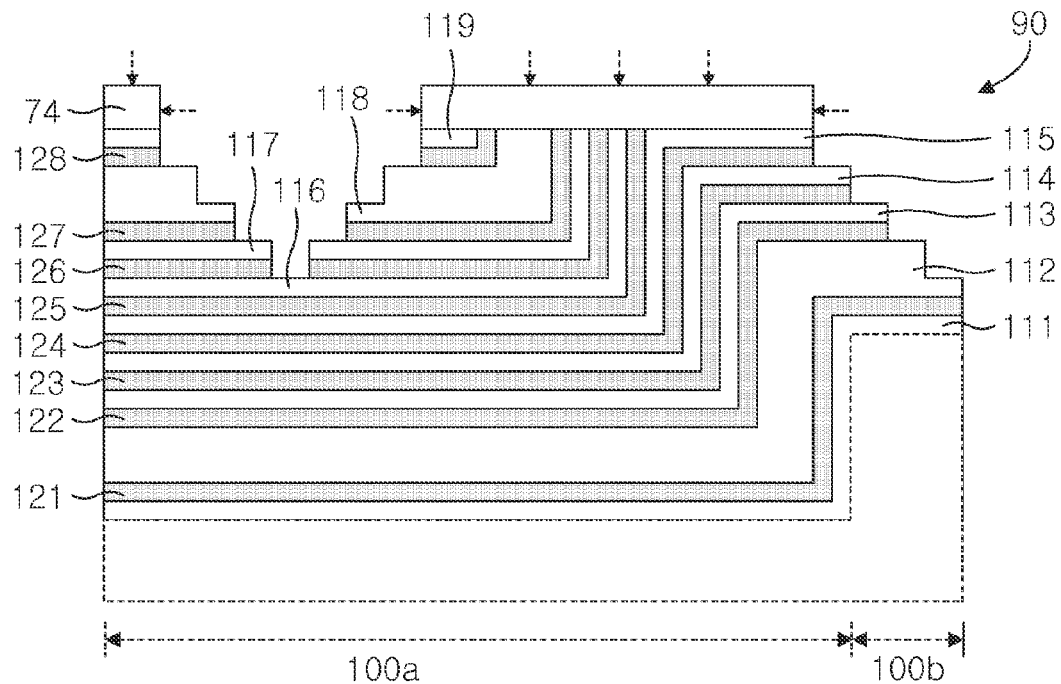

Referring to FIG. 31D, the mold stack 90 may be fourthly patterned using a fourth mask 74 as an etch mask. The fourth mask 74 may be formed by a trimming process shrinking the third mask 73. The fourth patterning of the mold stack 90 may be performed to etch portions of the ninth, eighth, seventh, fifth, fourth and second insulating layers 119, 118, 117, 115, 114 and 112 and portions of the eighth, seventh, sixth, fourth and third sacrificial layers 128, 127, 126, 124 and 123, which are newly exposed by the trimming process. As the result of the first to fourth patterning processes, the ninth and fifth insulating layers 119 and 115 and the eighth and fourth sacrificial layers 128 and 124 may be four times patterned, the fourth and eighth insulating layers 114 and 118 and the third sacrificial layer 123 may be thrice patterned, the seventh sacrificial layer 127 may be twice patterned, and the seventh insulating layer 117 and the sixth sacrificial layer 126 on the second insulating layer 112 and the second insulating layer 112 on the circumference region 100b may be patterned. The fourth patterning of the mold stack 90 may be performed not to expose or etch the first sacrificial layer 121, and thus the second insulating layer 112 may be formed to have a stepwise portion, as shown in FIG. 31D.

Further processing to form a completed device may be performed in the same manner as described with respect to previous embodiments. For example, processing may continue as shown in FIGS. 7A-11B.

Still further, in addition to insulating layers having different thickness, the sacrificial layers may have different thickness, which results in the conductive layers having different thicknesses.

[The Case of Increasing the Layer Number of the Gate Stack]

Figure 32A:
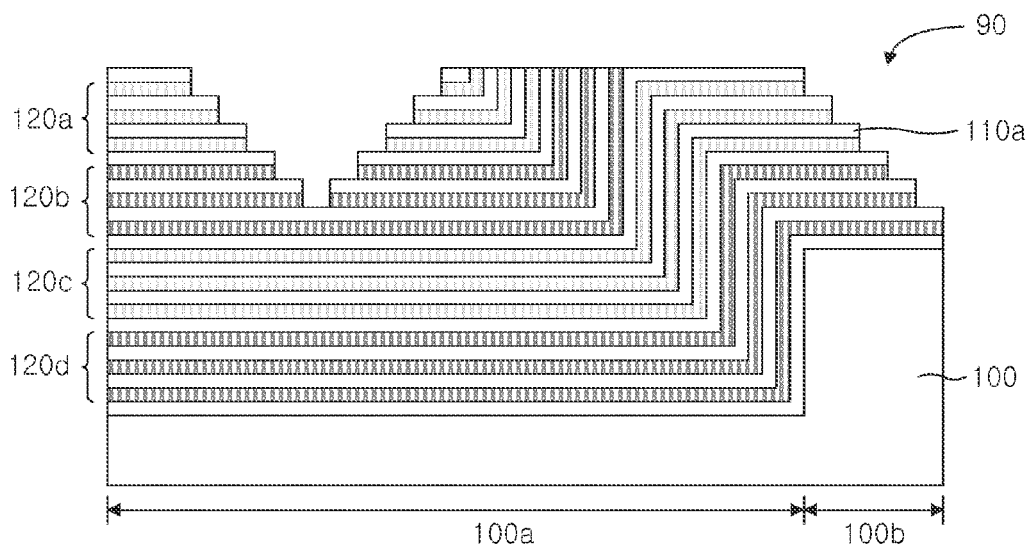
FIGS. 32A and 32B are sectional views illustrating a method of fabricating a semiconductor device according to certain example embodiments of the inventive concepts.
Figure 32B:
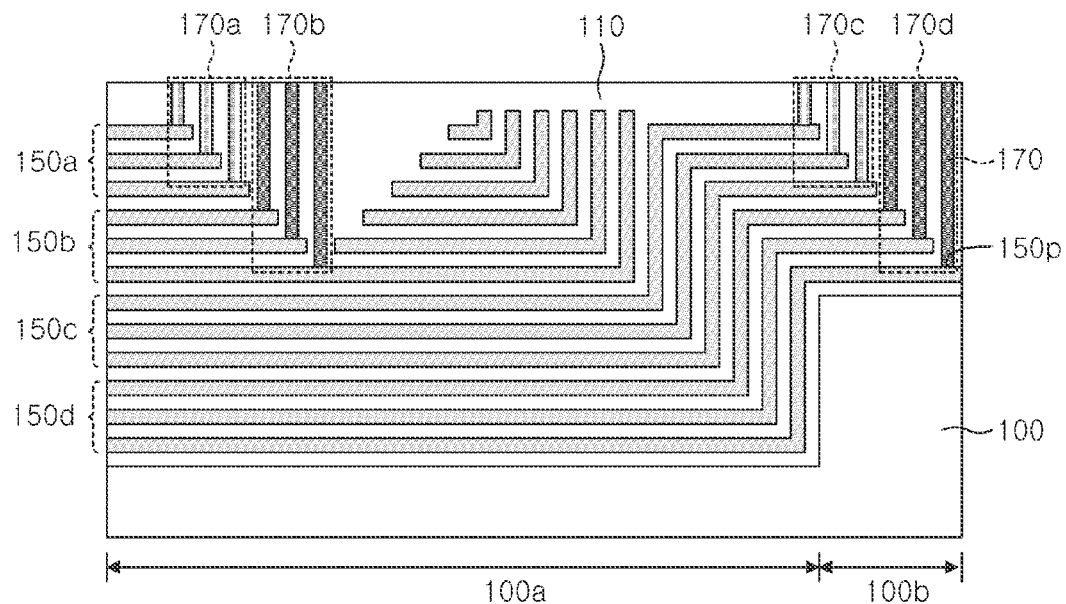

FIGS. 32A and 32B are sectional views illustrating a method of fabricating a semiconductor device according to certain example embodiments of the inventive concepts.

Referring to FIG. 32A, the terracing process and the metal plugging process may be more effective in the case that the layer number of the mold stack 90 increases. For instance, consider a mold stack 90 including twelve sacrificial layers and insulating layers 110a on the terraced substrate 100. Hereinafter, for ease of explanation, the sacrificial layers may be classified into four groups, i.e., first, second, third and fourth sacrificial layer groups 120a, 120b, 120c and 120d, which are stacked on the terraced substrate 100 in reverse order. Each of the first to fourth sacrificial layer groups 120a to 120d may be configured to include three sacrificial layers.

In the case that the first to fourth sacrificial layer groups 120a-120d are stacked on a horizontally flat substrate, the terracing process should be performed eleven times in order that the mold stack 90 has the terraced structure. By contrast, according to example embodiments of the inventive concepts, since the mold stack 90 is formed on the terraced substrate 100, the terraced structure can be formed by performing the terracing process about five times. For instance, the terraced structure can be simultaneously realized in the first and third sacrificial layer groups 120a and 120c by performing the terracing process three times and in the second and fourth sacrificial layer groups 120b and 120d by performing the terracing process two times.

Referring to FIG. 32B, the first to fourth sacrificial layer groups 120a-120d may be replaced by first, second, third, and fourth conductive layer groups 150a, 150b, 150c and 150d, and metal contact plugs 170 may be formed to be connected to contact areas 150p of the conductive layer groups 150a to 150d. For ease of explanation, the metal contact plugs 170 may be classified into four groups, i.e., first, second, third and fourth metal contact plug groups 170a, 170b, 170c and 170d, which are connected to the first to fourth conductive layer group 150a-150d, respectively.

If the first to fourth conductive layer groups 150a-150d are formed to have a pyramid-shaped sidewall profile, the metal plugging process may be performed several times in order to form the metal contact plugs 170 connected to the twelve conductive layers. For instance, if three metal contact plugs are simultaneously formed during each of the metal plugging processes, the metal plugging process should be performed four times. By contrast, according to example embodiments of the inventive concepts, by performing the metal plugging process about two times, the metal contact plugs 170 can be connected to all of the twelve conductive layers. For instance, the first and third metal contact plug groups 170a and 170c, which are connected to the contact areas 150p of the first and third conductive layer groups 150a and 150c, respectively, can be simultaneously formed by performing the metal plugging process one time, and the second and fourth metal contact plug groups 170b and 170d, which are connected to the contact areas 150p of the second and fourth conductive layer groups 150b and 150d, respectively, can be simultaneously formed.

Embodiments described above can be applied to the case of stacking the conductive layers, instead of the sacrificial layer groups 120a-120d, in the same or similar manner.

[Planarization of a Mold Stack: Modified Example Embodiments]

Figure 33A:
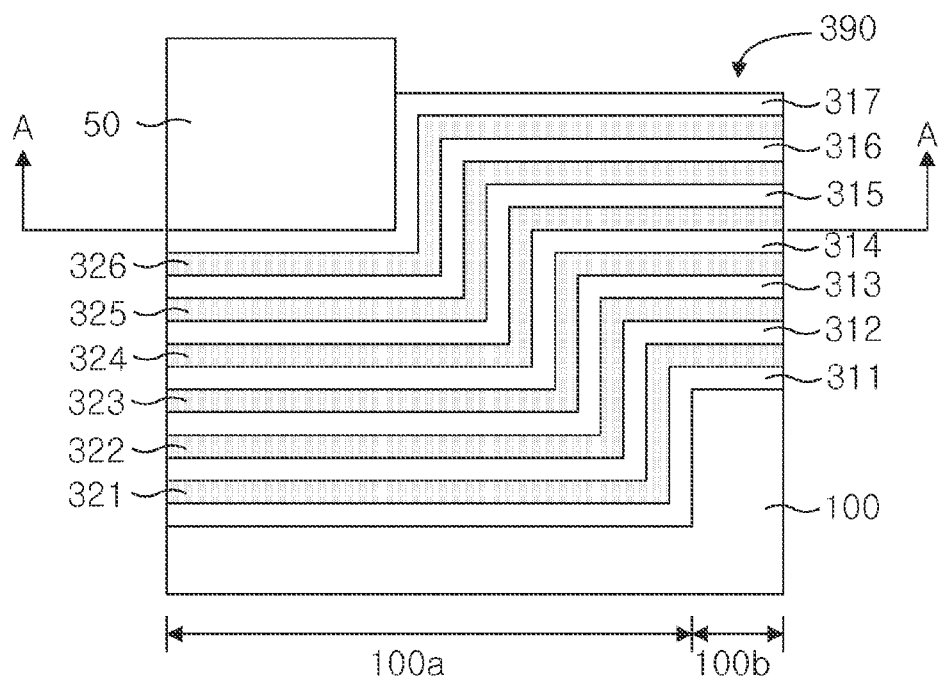
FIGS. 33A and 33B are sectional views illustrating a method of forming a mold stack according to modified example embodiments of the inventive concepts.
Figure 33B:
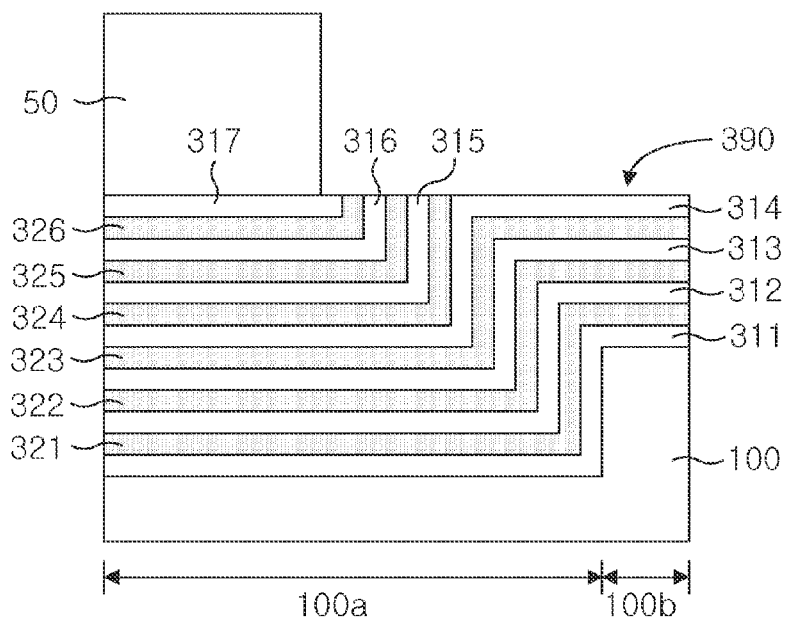

FIGS. 33A and 33B are sectional views illustrating a method of forming a mold stack according to modified example embodiments of the inventive concepts.

Referring to FIG. 33A, a mold stack 390 may be formed on the substrate 100 with the recess region 100a and the circumference region 100b. The mold stack 390 may include a plurality of first layers 311-317 and a plurality of second layers 321-326, which may be alternatingly and conformably stacked on the substrate 100. The first layers 311-317 may be formed of an insulating layer, and the second layers 321-326 may be formed of other insulating layer having an etch selectivity with respect to the first layers 311-317 or of a conductive layer. The mold stack 390 may have a stepwise top surface, for instance, including lowered and elevated portions. A mask 50 may be formed on the lowered portion of the mold stack 390, and then the mold stack 390 may be patterned by an anisotropic etching process using the mask 50 as an etch mask. In some embodiments, the patterning of the mold stack 390 may be performed to remove upper half of the mold stack 390 on the circumference region 100b, as depicted by a line A-A' of FIG. 33A. The substrate 100 may be prepared in such a way that a sidewall of the circumference region 100b is perpendicular to a bottom surface of the recess region 100a or is sloped at an angle of less or more than about 90 degree, as shown in FIG. 11C.

As shown in FIG. 33B, the mold stack 390 may be planarized as the result of the anisotropic etching process to have the first layers 311-317 and the second layers 321-326 having a 'L'-shape or a stepwise shape.

[Planarization of a Mold Stack: Other Modified Example Embodiments]

Figure 34A:
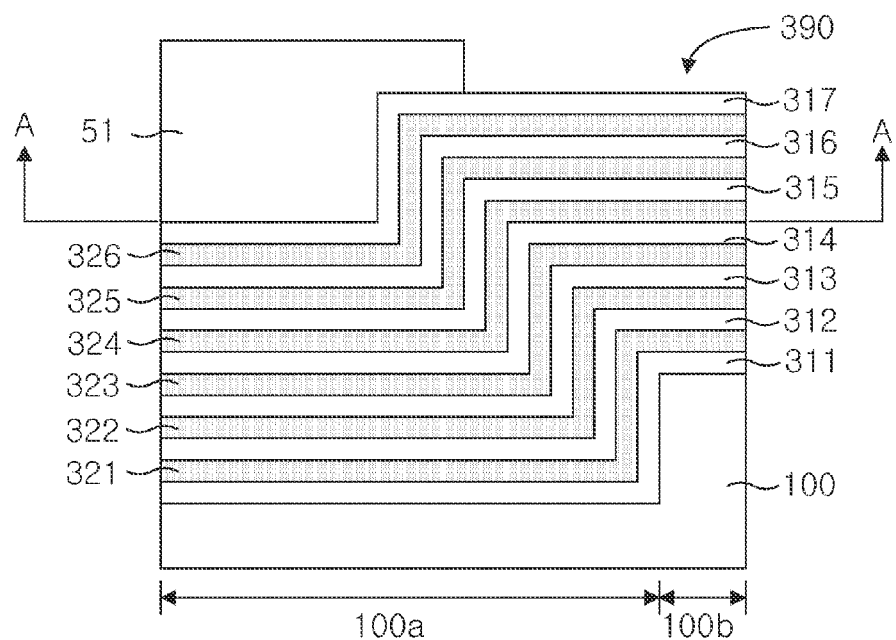
FIGS. 34A and 34B are sectional views illustrating a method of forming a mold stack according to other modified example embodiments of the inventive concepts.
Figure 34B:
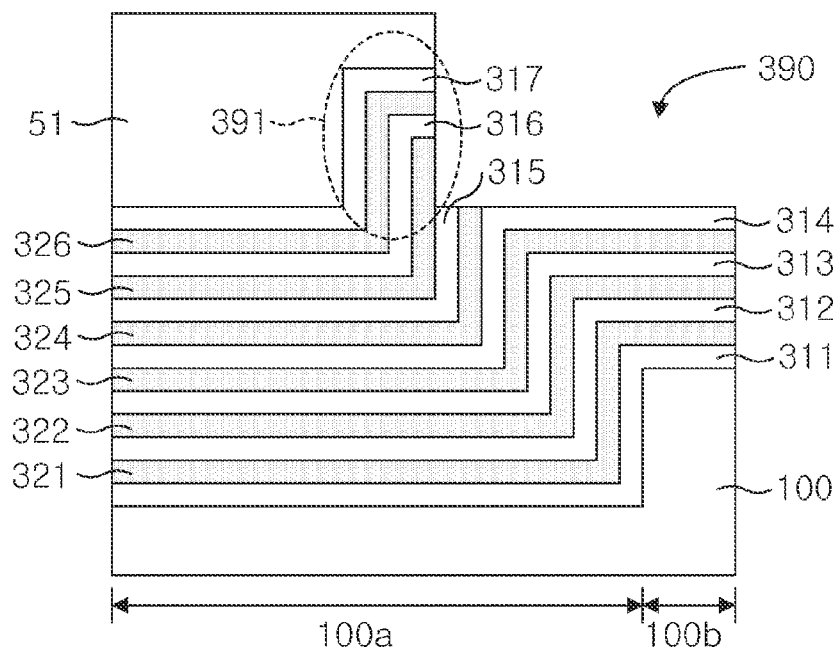

FIGS. 34A and 34B are sectional views illustrating a method of forming a mold stack according to other modified example embodiments of the inventive concepts.

Referring to FIGS. 34A and 34B, a mask 51 may be formed on the mold stack 390 to cover the whole top surface of the lowered portion and a portion of a top surface of the elevated portion. Thereafter, the mold stack 390 may be anisotropically etched using the mask 51 as an etch mask. As a result, as shown in FIG. 34B, a portion of the elevated portion exposed by the mask 51 may be partially removed. Here, other portion 391 of the elevated portion covered with the mask 51 may be removed by a subsequent removing process, e.g., a CMP process, such that the mold stack 390 may have a planarized top surface.

[Planarization of a Mold Stack: Still Other Modified Example Embodiments]

Figure 35A:
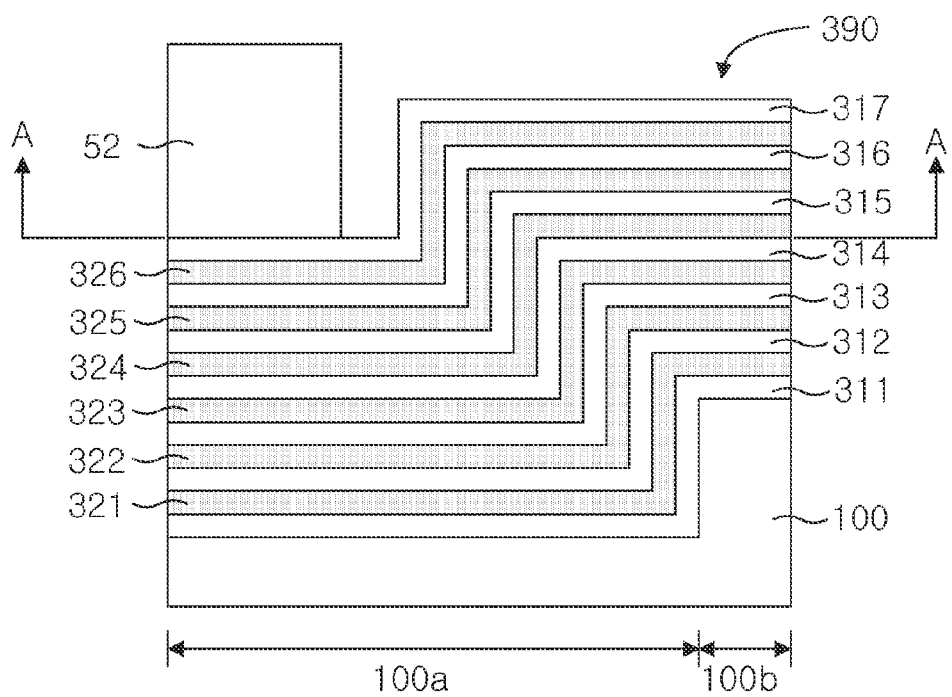
FIGS. 35A through 35C are sectional views illustrating a method of forming a mold stack according to still other modified example embodiments of the inventive concepts.
Figure 35B:
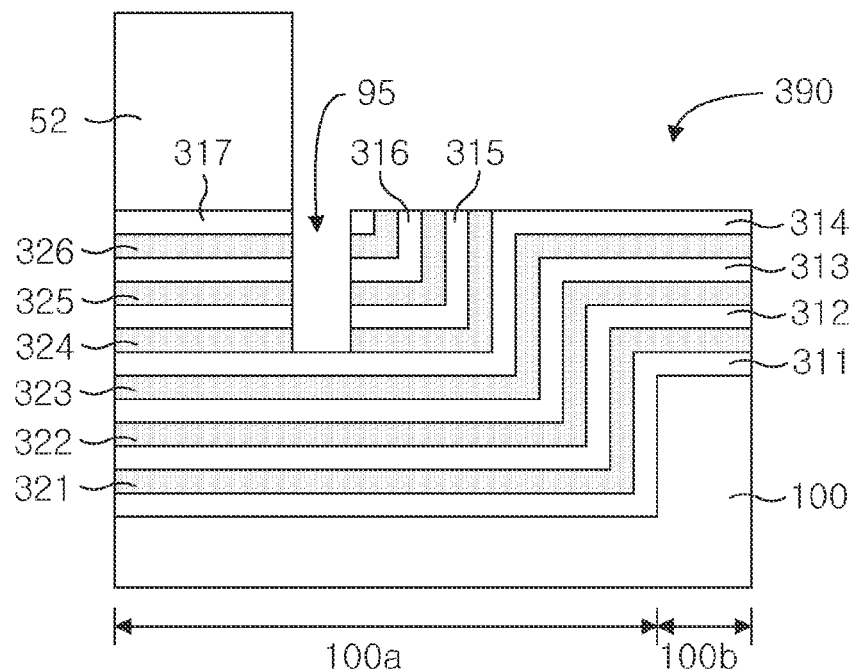
Figure 35C:
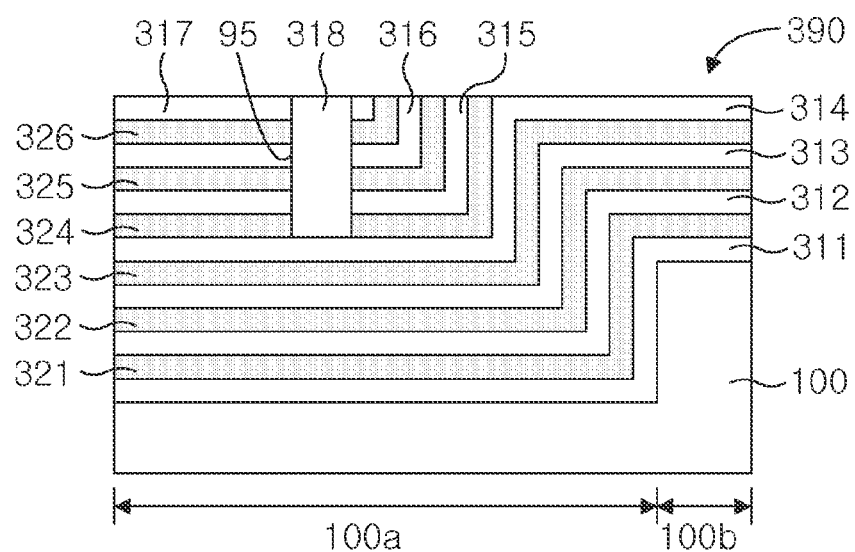

FIGS. 35A through 35C are sectional views illustrating a method of forming a mold stack according to still other modified example embodiments of the inventive concepts.

Referring to FIG. 35A, a mask 52 may be formed on the mold stack 390 to partially cover the lowered portion. That is, the mask 52 may be formed to expose the whole elevated portion and a portion of the lowered portion adjacent to the elevated portion. Thereafter, the mold stack 390 may be anisotropically etched using the mask 52 as an etch mask. As a result, as shown in FIG. 35B, the elevated portion may be removed and the portion of the lowered portion exposed by the mask 52 may be recessed to form a groove 95. As shown in FIG. 35C, the groove 95 may be filled with an insulating layer 318.

[Planarization of a Mold Stack: Even Other Modified Example Embodiments]

Figure 36A:
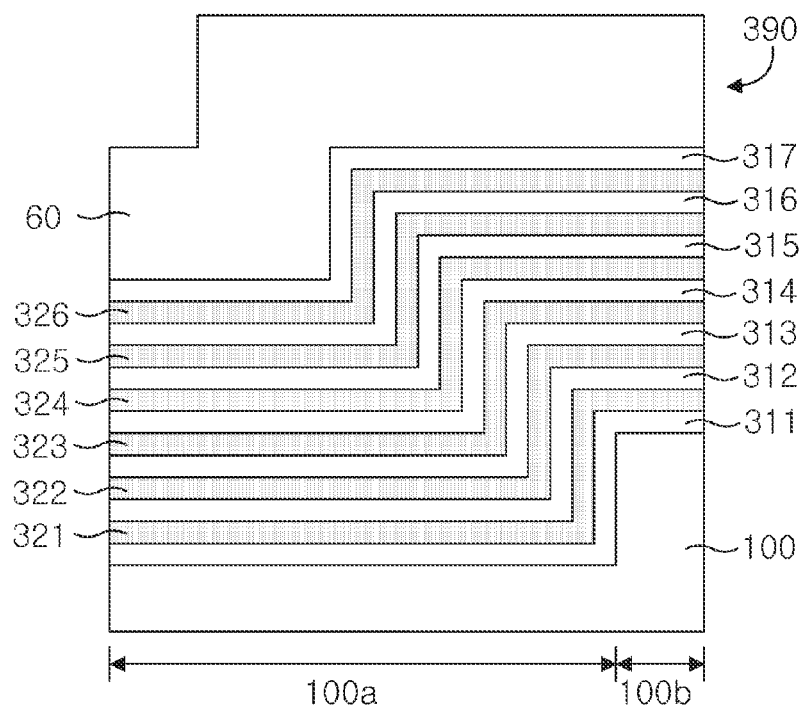
FIGS. 36A through 36C are sectional views illustrating a method of forming a mold stack according to even other modified example embodiments of the inventive concepts.
Figure 36B:
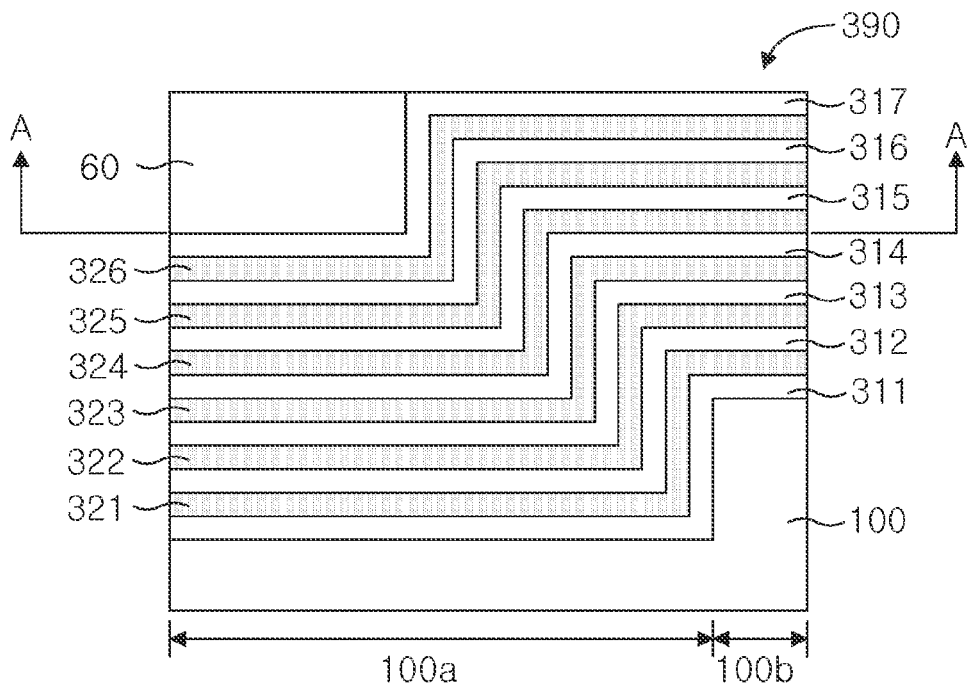
Figure 36C:
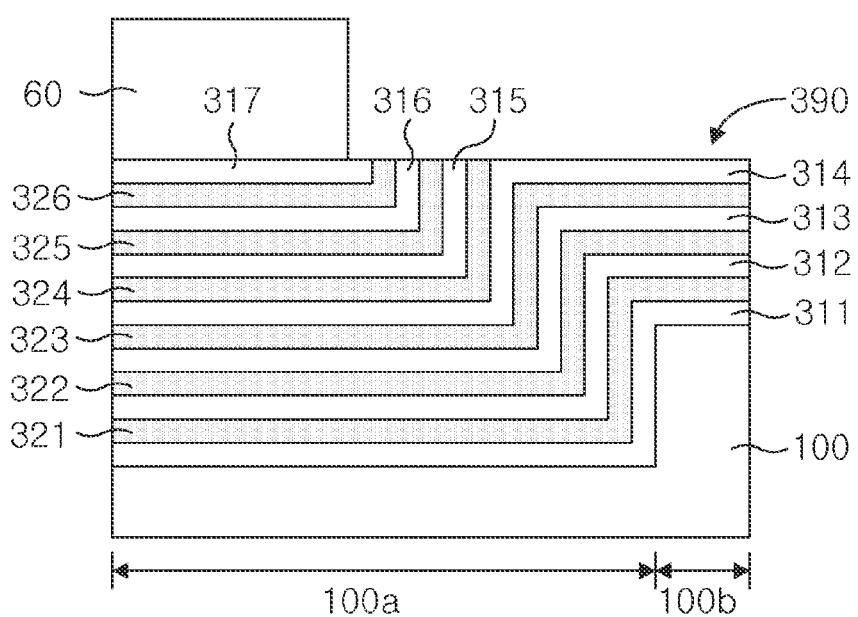

FIGS. 36A through 36C are sectional views illustrating a method of forming a mold stack according to even other modified example embodiments of the inventive concepts.

Referring to FIG. 36A, a third layer 60 may be formed on the whole top surface of the mold stack 390. The third layer 60 may be formed of, for instance, an insulating material and have a thickness equivalent to or greater than a height difference between the lowered and elevated portions. In some embodiments, the third layer 60 may have a stepwise profile originated from a transcription of a top surface profile of the substrate 100. The mold stack 390 and the third layer 60 may be planarized using, for instance, a CMP or etch-back process to expose the uppermost layer of the first layers 311-317. As the result of the planarization, a portion of the third layer 60 may remain on the lowered portion of the mold stack 390, as shown in FIG. 36B, and the resultant structure may have a flat top surface. Thereafter, as shown in FIG. 36C, the mold stack 390 may be patterned by an anisotropic etching process using the remaining third layer 60 as an etch mask. In some embodiments, the patterning of the mold stack 390 may be performed to remove upper half of the mold stack 390 on the circumference region 100b, as depicted by a line A-A' of FIG. 36A. Thereafter, the remaining third layer 60 may be removed to expose the mold stack 390 having a planarized top surface.

[Planarization of a Mold Stack: Yet Other Modified Example Embodiments]

Figure 37A:
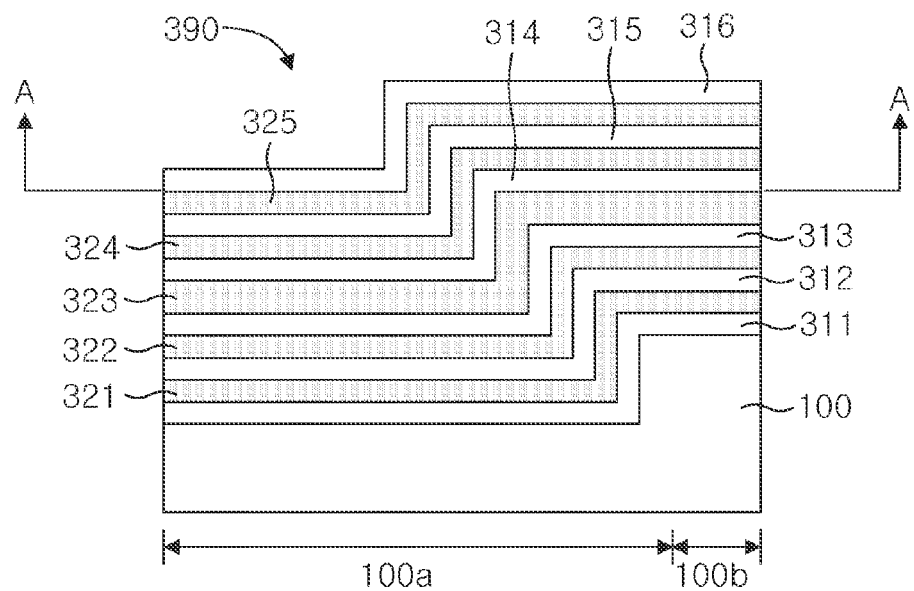
FIGS. 37A and 37B are sectional views illustrating a method of forming a mold stack according to yet other modified example embodiments of the inventive concepts.
Figure 37B:
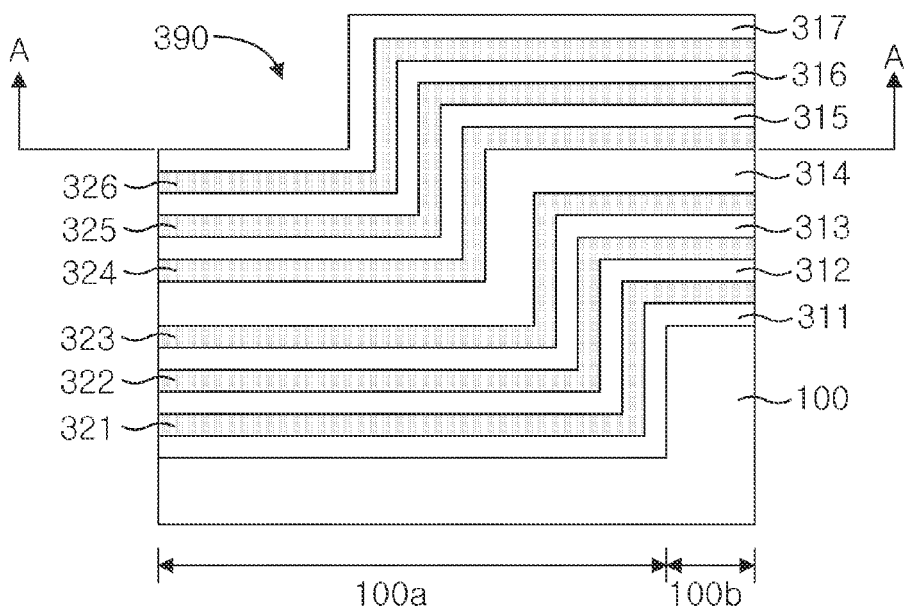

FIGS. 37A and 37B are sectional views illustrating a method of forming a mold stack according to yet other modified example embodiments of the inventive concepts.

Referring to FIG. 37A, an intermediate one of the second layers 321-325 (e.g., denoted by the reference numeral 323) may be formed to have a thickness greater than the others of the second layers 321-325. In this case, the patterning of the mold stack 390 may be performed using the intermediate second layer 323 as an etch stop layer, in order to remove the elevated portion to the level indicated by a line A-A' of FIG. 37A. Alternatively, as shown in FIG. 37B, an intermediate one of the first layers 311-317 (e.g., denoted by the reference numeral 314) may be formed to have a thickness greater than the others of the first layers 311-317. In this case, the patterning of the mold stack 390 may be performed using the intermediate first layer 314 as an etch stop layer, in order to remove the elevated portion to the level indicated by a line A-A' of FIG. 37B. In some embodiments, similar to the embodiments described with reference to FIGS. 33A, 34A, 35A, and 36B, a mask may be disposed on the lowered portion of the mold stack 390, during the patterning of the mold stack 390.

[Applications of Embodiments]

Figure 38A:
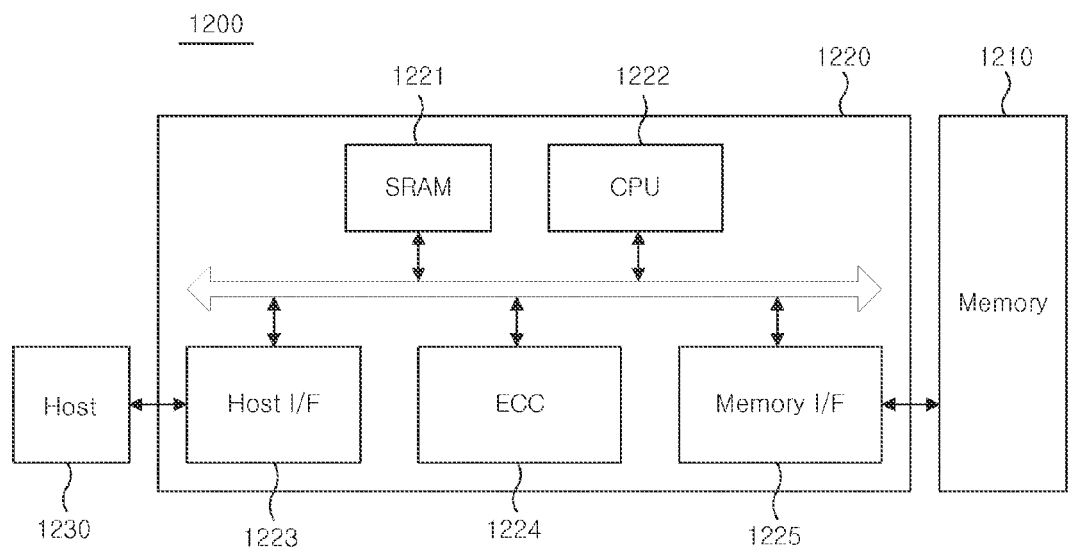
FIG. 38A is a block diagram of a memory card including a semiconductor device according to example embodiments of the inventive concepts.

FIG. 38A is a block diagram of a memory card including a semiconductor device according to example embodiments of the inventive concepts.

Referring to FIG. 38A, a memory card 1200 may include a memory controller 1220 controlling general data exchanges between a host and the memory device 1210. A static random access memory (SRAM) 1221 may be used as an operating memory of a processing unit 1222. A host interface 1223 may include a data exchange protocol of a host connected to a memory card 1200. An error correction block 1224 may detect and correct errors included in data read from a multi-bit memory device 1210. A memory interface 1225 may interface with the memory device 1210. A processing unit 1222 may perform general control operations for data exchange of the memory controller 1220. The memory card 1200 may be realized using a memory device 1210 including at least one of the semiconductor devices 1, 4 and 5 according to example embodiments of the inventive concepts.

Figure 38B:
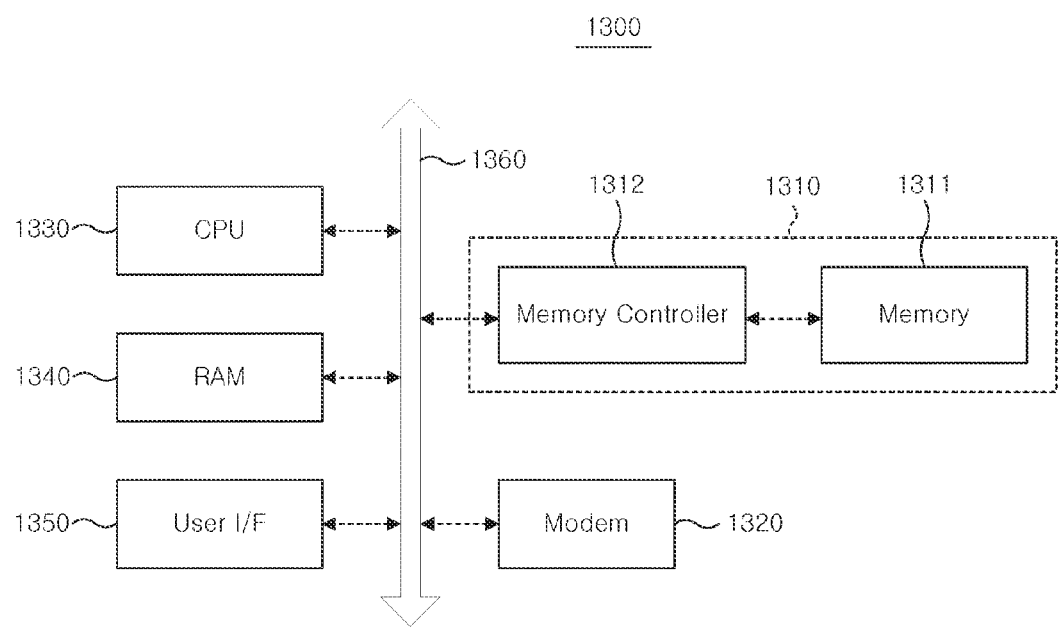
FIG. 38B is a block diagram of an information processing system including a semiconductor device according to example embodiments of the inventive concepts.

FIG. 38B is a block diagram of an information processing system including a semiconductor device according to example embodiments of the inventive concepts.

Referring to FIG. 38B, an information processing system 1300 may be realized using a memory system 1310 including at least one of the semiconductor devices 1, 4 and 5 according to example embodiments of the inventive concepts. For instance, the information processing system 1300 may be a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory system described with respect to FIG. 38A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the inventive concepts.

According to example embodiments of the inventive concepts, word lines may be configured to have contact areas located at elevated levels. This configuration enables to simplify a terracing process and/or a metal plugging process. This simplification in the fabricating process may result in an increase in product yield and or a reduction in fabricating cost. Furthermore, it is possible to realize a semiconductor device having improved characteristics, because failure rates can be reduced by the simplification in the fabricating process.

While example embodiments of the inventive concepts have been particularly shown and described, it will be understood by one of ordinary skill in the art that variations in form and detail may be made therein without departing from the spirit and scope of the attached claims.

The invention claimed is:

1. A semiconductor device, comprising:
a memory cell array formed on a substrate, the memory cell array including,
a gate stack including alternating conductive and insulating layers, a first lower conductive layer in the gate stack having a portion disposed below a first upper conductive layer in the gate stack, and a first contact area of the first lower conductive layer disposed substantially higher than a second contact area of the first upper conductive layer; and
first and second contact plugs extending into the gate stack to contact the first and second contact areas, respectively, wherein
the gate stack includes a second lower conductive layer and a second upper conductive layer, the second lower conductive layer has a portion disposed below the second upper conductive layer, and a third contact area of the second lower conductive layer is disposed higher than a fourth contact area of the second upper conductive layer,
the first lower conductive layer is disposed below the second lower conductive layer, and the first upper conductive layer is disposed below the second upper conductive layer, and
the first contact area and the fourth contact area are at a substantially same level.

2. The semiconductor device of claim 1, wherein the first lower conductive layer has a stair shaped cross-section and the second upper conductive layer has one of an L-shaped cross-section and a linear cross-section.

3. The semiconductor device of claim 2, wherein a riser of the stair-shaped cross-section is substantially perpendicular to a runner of the stair-shaped cross-section.

4. The semiconductor device of claim 2, wherein a riser and a runner of the stair shaped cross-section form an angle greater than 90 degrees.

5. The semiconductor device of claim 1, wherein at least one of the conductive layers has a stair shaped cross-section and at least one of the conductive layers has an L-shaped cross-section.

6. The semiconductor device of claim 5, wherein
the substrate has a first upper surface and a second upper surface, and the second upper surface is higher than the first upper surface; and the conductive layer having the stair shaped cross-section is formed over the first and second upper surfaces; and the conductive layer having the L-shaped cross-section is formed over the first upper surface.

7. The semiconductor device of claim 6, wherein a peripheral circuit device is disposed over the second surface.

8. The semiconductor device of claim 5, wherein an insulation pattern is disposed over a first portion of the substrate; and the conductive layer having the stair shaped cross-section is formed over the insulation pattern and a second portion of the substrate not covered by the insulation pattern; and the conductive layer having the L-shaped cross-section is formed over the second portion of the substrate.

9. The semiconductor layer of claim 8, wherein the insulation pattern is disposed over a peripheral circuit device.

10. The semiconductor device of claim 1, wherein at least one of the insulation layers has a different thickness than another of the insulation layers.

11. The semiconductor device of claim 1, further comprising:

at least one vertical channel penetrating the gate stack; and a memory layer surrounding a length of the vertical channel.

12. The semiconductor device of claim 11, wherein the memory layer includes a tunnel layer, a charge trap layer and a blocking layer.

13. The semiconductor device of claim 11, wherein the memory layer includes a variable resistance material.

14. The semiconductor device of claim 1, further comprising:

at least one vertical channel penetrating the gate stack;

a first memory layer surrounding a length of the vertical channel; and a plurality of second memory layers, each second memory layer disposed between the vertical channel and an associated one of the conductive layers.

* * * * *